(12) United States Patent  
Camp et al.

(10) Patent No.: US 9,007,825 B2
(45) Date of Patent: Apr. 14, 2015

(54) REDUCTION OF READ DISTURB ERRORS

(71) Applicant: International Business Machines Corporation, Armonk, NY (US)

(72) Inventors: Charles J. Camp, Sugar Land, TX (US); Holloway H. Frost, Houston, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/281,171

(22) Filed: May 19, 2014

(65) Prior Publication Data

US 2014/0301140 A1 Oct. 9, 2014

Related U.S. Application Data

(63) Continuation of application No. 13/481,927, filed on May 28, 2012, now Pat. No. 8,730,721, which is a continuation of application No. 12/577,673, filed on Oct. 12, 2009, now Pat. No. 8,189,379, which is a continuation-in-part of application No. 12/566,421, filed on Sep. 24, 2009, now Pat. No. 7,818,525.

(60) Provisional application No. 61/233,218, filed on Aug. 12, 2009.

(51) Int. Cl.
*G11C 16/04* (2006.01)
*G11C 16/34* (2006.01)

(52) U.S. Cl.
CPC ........ *G11C 16/3418* (2013.01); *G11C 16/3427* (2013.01)

(58) Field of Classification Search
CPC .................. G11C 13/0033; G11C 16/3418

USPC .............. 365/185.02, 189.16, 189.07, 230.03
See application file for complete search history.

(56) References Cited

U.S. PATENT DOCUMENTS

| | | | |
|---|---|---|---|
| 5,170,400 | A | 12/1992 | Dotson |
| 5,416,738 | A | 5/1995 | Shrivastava |
| 5,734,919 | A | 3/1998 | Walsh et al. |
| 5,875,456 | A | 2/1999 | Stallmo et al. |
| 6,041,423 | A | 3/2000 | Tsukerman |
| 6,115,837 | A | 9/2000 | Nguyen et al. |
| 6,158,017 | A | 12/2000 | Han et al. |
| 6,282,039 | B1 | 8/2001 | Bartlett |
| 6,311,251 | B1 | 10/2001 | Merritt et al. |
| 6,347,359 | B1 | 2/2002 | Smith et al. |
| 6,411,549 | B1 | 6/2002 | Pathak et al. |
| 6,516,425 | B1 | 2/2003 | Belhadj et al. |
| 6,570,785 | B1 | 5/2003 | Mangan et al. |
| 6,684,345 | B2 | 1/2004 | Harari et al. |
| 6,718,437 | B2 | 4/2004 | Don et al. |
| 6,795,895 | B2 | 9/2004 | Merkey et al. |
| 6,867,999 | B2 | 3/2005 | Yoo et al. |
| 6,938,123 | B2 | 8/2005 | Willis et al. |
| 7,024,586 | B2 | 4/2006 | Kleiman et al. |

(Continued)

OTHER PUBLICATIONS

Shin, J.Y., et al., "FTL Design Exploration in Reconfigurable High-Performance SSD for Server Applications", ICS 2009, Jun. 8-12, 2009, pp. 338-349, USA, copyright 2009 ACM.

(Continued)

*Primary Examiner* — Tuan T Nguyen
(74) *Attorney, Agent, or Firm* — Locke Lord LLP

(57) ABSTRACT

Methods and apparatuses for reduction of Read Disturb errors in a memory system utilizing modified or extra memory cells.

22 Claims, 16 Drawing Sheets

(56) References Cited

U.S. PATENT DOCUMENTS

| | | | |
|---|---|---|---|
| 7,075,839 B2 | 7/2006 | Mukunoki et al. | |
| 7,099,190 B2 | 8/2006 | Noguchi et al. | |
| 7,120,826 B2 | 10/2006 | Fore et al. | |
| 7,157,953 B1 | 1/2007 | Nguyen | |
| 7,162,678 B2 | 1/2007 | Saliba | |
| 7,173,852 B2 | 2/2007 | Gorobets et al. | |
| 7,193,901 B2 | 3/2007 | Ruby et al. | |
| 7,299,401 B2 | 11/2007 | Fukuda | |
| 7,328,307 B2 | 2/2008 | Hoogterp | |
| 7,405,964 B2 | 7/2008 | Philipp et al. | |
| 7,409,492 B2 | 8/2008 | Tanaka et al. | |
| 7,437,600 B2 | 10/2008 | Tachikawa | |
| 7,454,639 B2 | 11/2008 | Jain et al. | |
| 7,492,660 B2 | 2/2009 | Harari et al. | |
| 7,502,886 B1 | 3/2009 | Kowalchik et al. | |
| 7,577,866 B1 | 8/2009 | Fan et al. | |
| 7,710,777 B1 | 5/2010 | Montierth et al. | |
| 7,721,146 B2 | 5/2010 | Polisetti et al. | |
| 7,734,865 B2 | 6/2010 | Tanaka | |
| 7,818,525 B1 | 10/2010 | Frost | |
| 7,890,795 B1 | 2/2011 | Madnani et al. | |
| 8,009,480 B2* | 8/2011 | Abiko et al. | 365/185.18 |
| 8,085,584 B1 | 12/2011 | Kale et al. | |
| 8,189,379 B2 | 5/2012 | Camp et al. | |
| 8,248,869 B1 | 8/2012 | Chan et al. | |
| 8,422,303 B2* | 4/2013 | Franca-Neto et al. | 365/185.2 |
| 8,649,215 B2* | 2/2014 | Franca-Neto et al. | 365/185.02 |
| 8,730,721 B2* | 5/2014 | Camp et al. | 365/185.02 |
| 2003/0120864 A1 | 6/2003 | Lee et al. | |
| 2005/0086575 A1 | 4/2005 | Hassner et al. | |
| 2005/0144363 A1 | 6/2005 | Sinclair | |
| 2006/0184723 A1 | 8/2006 | Sinclair et al. | |
| 2006/0200481 A1 | 9/2006 | Goyan | |
| 2007/0232906 A1 | 10/2007 | Alexandru | |
| 2007/0294570 A1 | 12/2007 | Polisetti et al. | |
| 2008/0016435 A1 | 1/2008 | Goel | |
| 2008/0052451 A1 | 2/2008 | Pua | |
| 2008/0059707 A1 | 3/2008 | Makineni et al. | |
| 2008/0098158 A1 | 4/2008 | Kitahara | |
| 2008/0106935 A1 | 5/2008 | Kim et al. | |
| 2008/0282024 A1 | 11/2008 | Biswas | |
| 2008/0288436 A1 | 11/2008 | Priya | |
| 2008/0288814 A1 | 11/2008 | Kitahara | |
| 2009/0168525 A1 | 7/2009 | Olbrich et al. | |
| 2009/0172254 A1 | 7/2009 | Chen | |
| 2009/0172335 A1 | 7/2009 | Kulkarni | |
| 2009/0193174 A1 | 7/2009 | Reid | |
| 2009/0193314 A1 | 7/2009 | Melliar-Smith et al. | |
| 2009/0240873 A1 | 9/2009 | Yu et al. | |
| 2009/0327840 A1 | 12/2009 | Moshayedi | |
| 2010/0005228 A1 | 1/2010 | Fukutomi et al. | |
| 2010/0017650 A1 | 1/2010 | Chin et al. | |
| 2010/0023675 A1 | 1/2010 | Chen et al. | |
| 2010/0083040 A1 | 4/2010 | Voigt et al. | |
| 2010/0107021 A1 | 4/2010 | Nagadomi et al. | |
| 2010/0202203 A1 | 8/2010 | Choi et al. | |
| 2013/0044535 A1* | 2/2013 | Shimakawa | 365/148 |
| 2013/0314989 A1* | 11/2013 | Wakisaka et al. | 365/185.03 |

OTHER PUBLICATIONS

Wu, C.H., "A Time-Predictable System Initialization Design for Huge-Capacity Flash-Memory Storage Systems", CODES+ISSS 2008, Oct. 19-24, 2008, pp. 13-18, USA, copyright 2008 ACM.

Greenan, K., Long, D., Miller, E., Schwarz, T. and Wildani, A., "Building Flexible, Fault-Tolerant Flash-based Storage Systems," Proceedings of the 5th Workshop on Hot Topics in System Dependability (HotDep 2009), Jun. 2009.

Endoh, T., Shimizu, K., Iizuka, H. and Masuoka, F., "A New Write/Erase Method to Improve the Read Disturb Characteristics Based on the Decay Phenomena of Stress Leakage Current for Flash Memories," IEEE Transactions on Electron Devices, vol. 45, No. 1, pp. 98-104, Jan. 1998.

Lue, H.T., Lai, S.C., Hsu, T.H., Du, P.Y., Wang, S.Y., Hsieh, K.Y., Liu, R. and Lu, C.Y., "Understanding Barrier Engineered Charge-Trapping NAND Flash Devices With and Without High-K Dielectric," The 47th Annual IEEE International Reliability Physics Symposium, Apr. 2009, pp. 874-882, Montreal.

Brand, A., Wu, K., Pan, S. and Chin, D., "Novel Read Disturb Failure Mechanism Induced by FLASH Cycling," The 31st Annual IEEE International Reliability Physics Symposium, Mar. 1993, pp. 127-132, Atlanta, Georgia.

Takeuchi, K., Satoh, S., Tanaka, T., Imamiya, K.I. and Sakui, K., "A Negative Vth Cell Architecture for Highly Scalable, Excellently Noise-Immune, and Highly Reliable NAND Flash Memories," IEEE Journal of Solid-State Circuits, vol. 34, No. 5, May 1999, pp. 675-684.

Cooke, J., "Flash Memory Technology Direction." Micron Technology, Inc., Microsoft WinHEC 2007, May 2, 2007.

Cooke, J., "The Inconvenient Truths of NAND Flash Memory," Memory Summit, Aug. 2007, Santa Clara, California.

Son, Y.S., International Search Report for International Patent Application No. PCT/US2010/045129, Korean Intellectual Property Office, dated Mar. 4, 2011.

Son, Y.S., Written Opinion for International Patent Application No. PCT/US2010/045129, Korean Intellectual Property Office, dated Mar. 4, 2011.

Agrawal, N., Prabhakaran, V., Wobber, T., Davis, J., Manasse, M. and Panigrahy, R., University of Wisconsin-Madison "Design Tradeoffs for SSD Performance." Proceedings of the USENIX Technical Conference, Jun. 2008, [retrieved from the Internet on Aug. 28, 2009 using <URL: http://research.microsoft.com/pubs/63596/USENIX-08-SSD.pdf>].

\* cited by examiner

REDUCTION OF READ DISTURB ERRORS

CROSS REFERENCE TO RELATED APPLICATIONS

This application for patent is a continuation of U.S. Non-Provisional application Ser. No. 13/481,927 (now U.S. Pat. No. 8,730,721), entitled "Efficient Reduction of Read Disturb Errors in NAND FLASH Memory," filed May 28, 2012; which is a continuation of U.S. Non-Provisional application Ser. No. 12/577,673 (now U.S. Pat. No. 8,189,379), entitled "Efficient Reduction of Read Disturb Errors in NAND FLASH Memory," filed Oct. 12, 2009; which is a continuation-in-part of U.S. Non-Provisional application Ser. No. 12/566,421 (now U.S. Pat. No. 7,818,525), entitled "Efficient Reduction of Read Disturb Errors in NAND FLASH Memory," filed Sep. 24, 2009; which claims priority to U.S. Provisional Application Ser. No. 61/233,218, entitled "Efficient Reduction of Read Disturb Errors in NAND FLASH Memory," filed Aug. 12, 2009; all of the foregoing applications being incorporated herein by reference.

STATEMENT REGARDING FEDERALLY SPONSORED RESEARCH

Not applicable.

REFERENCE TO APPENDIX

Not applicable.

BACKGROUND OF THE INVENTION

1. Field of the Invention

This disclosure relates generally to methods and apparatus for reducing or eliminating certain data errors associated with FLASH memory devices utilizing a NAND architecture.

2. Description of the Related Art

In general, a FLASH memory device is one type of memory device that can retain stored digital data, even when no power is being provided to the device.

Typical FLASH memory devices are formed from a number of individual storage elements, where each storage element comprises a memory cell that includes a transistor and a charge storage area. In many FLASH devices, the charge storage area comprises either a floating gate or a charge-trapping region. The presence or absence of an electric charge in the charge storage area of a cell can be used to store a logic "1" or a logic "0" in the cell.

For many FLASH memory devices, the presence of a relatively large electrical charge on the cell corresponds to a logic "1" and the absence of such a charge corresponds to a logic "0." It should be noted, however, that this assignment of a logic "1" to the condition where charge is present is somewhat arbitrary and the presence of a charge could be used to indicate a logic "0" and the absence of charge as a logic "1." For purposes of this disclosure, however, it will be presumed that the presence of charge corresponds to a logic "1" condition and the absence of charge to a logic "0."

The previous discussion of flash memory suggested the ability to store one of two logical states within a flash memory cell, a logical "0" or a logical "1". While this is true of SLC (single-level cell) flash memory, MLC (multi-level cell) flash memory provides the capability to store more than two logical states. MLC devices currently available at the time of this writing can store up to eight distinct logical states, corresponding to various different quantities of charge residing in a cell's charge storage area. While much of the discussion herein is centered on SLC flash memory, the read disturbance phenomenon and the mechanisms leading to it apply to all NAND FLASH memory, MLC as well as SLC. For simplicity, this discussion focuses primarily on SLC memory.

The presence or absence of the charge in the associated storage cell may be stored and/or detected in a variety of ways. Certain FLASH memory devices utilize a NAND architecture ("NAND FLASH memory devices") to store and read the digital data stored within the memory cells of the device. A NAND architecture is one in which several FLASH memory cells are connected to one another in series.

FIG. 1 generally illustrates a highly simplified NAND FLASH memory 100. FIG. 1 will be used to describe certain relevant aspects of the general operation of a NAND FLASH memory device.

In the example of FIG. 1, the NAND FLASH memory 100 includes nine memory cells 110a-110i, arranged in a three-by-three array.

For purposes of illustration, cells using a floating gate construction are used. In a floating gate transistor cell, it is common to identify a floating gate and a control gate, although other names may be used to describe these elements. The floating gate is generally electrically isolated from other transistor structures and is used to store electrical charge injected into it through a programming operation. The control gate is use to control the reading, writing (programming) and erasing of cells. Throughout this document, the term "gate", without any modifiers, is understood to refer to the control gate.

From top to bottom, the cells are coupled together in series to form what is sometimes called a bit line. As one example, cells 110a, 110d and 110g are coupled together in series to form a bit line. In the simplified illustrated example, a pull-up resistor is provided for each bit line. In an actual embodiment addressing circuitry, control transistors and other structures would be included. These elements are not illustrated in FIG. 1, which provides a highly simplified representation of a NAND FLASH memory.

Across the structure, the gates of cells sharing the same relative location are connected to one another. Thus, the gates of cells 110d, 110e, and 110f are coupled to one another. The coupling of these gates of the cell is such that all of the cells sharing a common gate line are typically read from or written to at the same time.

Typically, the memory cells within a NAND FLASH memory device are arranged into "Pages" and "Blocks." A Page is a group of data bits that are accessed, internal to the memory, generally in a parallel manner at the same time. Thus, in the example of FIG. 1, the cells 110d, 110e, and 110f could be considered to be a Page, in the sense that the gates of the three cells are coupled to one another such that the data within the three cells can be accessed at the same time. Like FIG. 1, most NAND FLASH memory devices perform read or write operations on a Page-by-Page basis.

While some flash memory devices support operations on "partial pages", these partial page operations are generally less efficient than their complete page counterparts. The underlying physical mechanisms associated with these partial page operations are roughly identical to their complete page counterparts, except for the fact that they operate on a subset of the overall FLASH memory page. As such, even though such pages may be referred to in some situations as "partial pages" because they are accessed in a parallel manner at the same time, they are considered "pages" for purposes of this disclosure. As noted above, as used herein a "Page" refers to a group of data bits within a given memory device that are accessed at the same time.

In a NAND FLASH memory, the Pages of data within the memory may be arranged so that they are associated with one another in one or more "Blocks" of data, typically as a result of the physical layout of the specific FLASH device at issue. In the example of FIG. 1, the grouping of the nine depicted memory cells 110a-110i could be considered to be a "Block" of data.

The exemplary device of FIG. 1 is highly simplified for purposes of discussion. Most actual FLASH memory devices will contain a substantially larger number of Pages and memory cells. For example, in current FLASH memory devices, the sizes of the Pages can vary from 512, 2,048, 4,096, or 8,192 bytes and the Blocks for a given FLASH device can vary in size, for example, from 32 Pages of 512 Bytes per Page for a 16 KB Block size; to 64 Pages of 2,048 bytes for a 128 KB Block size; to 64 Pages of 4,096 bytes for a 256 KB Block size; to 128 Pages of 4,096 bytes for a 512 KB Block size. The invention described herein does not presume a particular page size or architecture, beyond the architectural features leading to the read disturbance phenomenon described below.

In general, there are a number of operations that are performed within FLASH memory devices. The most common such operations are the ERASE, PROGRAM, and READ operations. During an ERASE operation, the logical bit stored in a given memory cell is set to a logical "0," which—in the example of discussion—corresponds to the absence of a substantial electric charge in the memory cell's charge storage area. The ERASE operation is typically performed by taking the voltage of the gates for the various storage devices within a Block, and other voltages that impact the amount of charge in the charge storage regions of the storage cells, to such levels that the electrical charge stored on the floating gates of the devices (or the charge trapping area) is reduced to zero or a low amount.

Because of the physical nature of most NAND FLASH memory devices, the ERASE operation is performed on a "Block" basis. Thus, anytime one desires to erase the data in a given memory cell within a given Block, one will also erase the data in all other memory cells within that Block.

After a Block of FLASH memory is erased, the individual data within the device can be programmed. The PROGRAM operation involves the writing of data into a memory cell that has been previously ERASED. When one desires to write a logical "1" into a previously erased FLASH memory cell—which would have no or low stored charge and therefore be at a logic "0" level—one may use the PROGRAM operation to inject charge onto the floating gates of the erased cells (or into their charge trapping regions) at levels sufficient to alter their threshold voltages. The threshold voltage reflects, in a general sense, the value of control gate voltage required to turn the transistor on (conducting) or off (non-conducting). The PROGRAM operation is typically performed by driving the control gate voltage level of the cell to be programmed to a sufficiently high level, while maintaining the voltage levels for the other terminals of the transistor in the cell at levels sufficient for charge injection to occur. When one desires to write a logical "0" into a previously erased FLASH memory cell, the PROGRAM operation involves the maintenance of the state of the cell established during the ERASE operation. The PROGRAM operation is performed in such a way that all of the bits being programmed (typically all of the bits within a single Page) will be programmed to have the desired "1" or "0" levels at the same time.

Once Pages of a FLASH memory device are programmed, they can be read. In general, the READ operation involves the reading of the logical data stored in the memory cells of a Page of FLASH data. Referring to FIG. 1, the READ operation would involve the application of a first voltage level (such as a high voltage level) to the top portion of each bit line within the Block, the application of a second voltage level (such as a low voltage level or zero) to the bottom of each bit line within the Block, the application of a third voltage to the control gates of all of the memory cells within the Block that reside in Pages that are not being read, and the application of a fourth voltage to the control gates of all of the memory cells within the Block that reside in the Page that is being read. The voltage applied to the gates of the unread cells is sufficient in magnitude to render the corresponding transistors conductive, regardless of their programming state, yet smaller in magnitude than the voltage supplied to a control gate in order to program a cell. The voltage applied to the gates of the cells being read is such that their transistors will be rendered either conductive or non-conductive, depending upon their programming state. Since all unread cells within a bit line are rendered conductive, while the cells being read may be conductive or non-conductive, the voltage at the top of each bit line may be pulled low (conductive) or remain high (non-conductive). The voltage level at the top of a bit line, therefore, gives an indication of the status (programmed or unprogrammed) of the one cell being read within that bit line.

For typical NAND flash memory devices in use at the time of this writing, the accumulated charge in a programmed cell will mandate a higher control gate voltage for the corresponding transistor to become conductive. Hence, a programmed cell will be non-conductive during a read operation and the top of the corresponding bit line will remain at a sufficiently high voltage to detect the fact that the cell being read has been programmed. Correspondingly, an unprogrammed cell will be conductive during a read operation and the top of the corresponding bit line will be pulled to a sufficiently low voltage to detect the fact that the cell being read has not been programmed. Taken as a whole, the voltage values at the top of the bit lines yield the programming status of all cells within a page being read.

As the above shows, for the exemplary NAND FLASH memory devices, the performance of a READ operation on one or more storage cell tends to impose elevated voltage stresses on the other unread cells within the same Block. This stress arises from the application of an elevated voltage to the control gates of the unread cells, sufficient in magnitude to render the unread cells conductive, regardless of their programming states. Over time, repeated application of this higher magnitude voltage to the gates of a given cell in a FLASH memory can result in charge migrating onto the floating gate of the cell or into its charge-trapping region. Over time, this charge can accumulate to the point that the amount of charge on a cell that was previously reflective of a logic "0" (or low or no charge state) can rise to a level where the cell is weakly programmed and, when subject to a READ operation, will erroneously produce a reading reflecting the storage of a logic "1" (higher charge state). This weak programming resulting from the READ operation cannot always be predicted accurately and can result in a number of bits in memory cells not associated with the cells being read becoming corrupted such that one could no longer determine whether the originally stored data bit was a "1" or a "0." Because the errors described above are induced by the disturbances created by the READ operation, they are known as "Read Disturb" errors.

While the preceding paragraphs describe operations and mechanisms generally encountered with SLC NAND FLASH memory, similar operations and mechanisms also pertain to MLC NAND FLASH memory. In such NAND FLASH memory devices, the control gates of unread cells are driven with a voltage that is guaranteed to render the unread cells conductive and that also leads to read disturbance in the unread cells. In such devices, the control gates of cells being read are driven with a different voltage, one that is such that the conductivity of the cell being read will differ based upon the quantity of charge stored in the cells' charge storage area or areas. MLC NAND FLASH memory is generally much more susceptible to read disturb errors than its SLC counterpart.

Read Disturb errors are a recognized condition of NAND FLASH memories. The most common approach for addressing the issue of Read Disturb errors in NAND FLASH memories is to utilize one or more error correction and checking ("ECC") techniques. While there are a number of different ECC techniques, ECC generally involves the utilization of one or more code bits (in addition to the original stored data bits) to allow one to determine and, in some instances correct, errors that may occur in data associated with the specific ECC code bit(s). ECC is typically implemented on a Page level and typically with respect to Pages that include one or more storage elements and, therefore, store data items comprising multiple bits. Alternatively, the quantity of data associated with a group of ECC code bits may be a subset of the overall Page, allowing multiple data sets within the same Page to be checked and/or corrected independently of one another. If one of the data bits associated with a particular group of ECC code bits becomes corrupted, the ECC bits can be used to detect the corrupted bit and possibly reconstruct it.

There are limitations associated with the use of ECC to address Read Disturb errors in NAND FLASH memory. For example, most ECC techniques are capable of identifying and addressing errors resulting from a disturbance of only one, or a small number of, the bits in the data item to which the ECC is applied. If more than one of the bits in the data item is disturbed, most ECC techniques will not be able to reconstruct the original data item. Moreover, if a large number of bits in a data item are errantly disturbed, certain ECC techniques will be incapable of identifying the existence of an error. Compounding this issue is the fact that Read Disturb errors occur in Pages that are not being read, while data and ECC bits must be read to perform checking and correction. Hence, the number of errors in a disturbed page can grow from a correctable number to an uncorrectable number without any warning that the seriousness of the induced errors is increasing. Thus, while ECC techniques may be widely utilized, they are not always effective.

Another approach used to address Read Disturb errors in NAND FLASH memory devices is to maintain a count of the number of times a given Block is accessed after an ERASE operation has occurred and to move the data in the Block to a new location and then perform an ERASE operation on the original Block if the READ count for the Block exceeds a pre-established number. While this approach can potentially avoid certain Read Disturb errors, it can limit the performance of a device or system utilizing this technique since the movement of the Block of data imposes burdens on the device or system in terms of overhead, speed, efficiency, power and other aspects that can degrade the overall performance of the device or system. Not only does it take an appreciable amount of overhead in terms of processing power and time to move the entire Block of data, the ERASE operation for the original Block can be time consuming. For systems where high speed read operations are desired, such burdens are undesirable and inefficient.

Another issue associated with the approach of maintaining a count and moving and erasing a data Block when the READ count for the Block is exceeded is that it imposes upon the system a relatively large number of ERASE operations. In particular, because the entire contents of a Block are moved and erased each time the predetermined count for that Block is exceeded, the processing of the data in a given Block that includes multiple, frequently accessed Pages, will require a large number of ERASE operations over the lifetime of the product. Because FLASH memory devices do not have unlimited lifetimes and because a given FLASH memory cell is subject to failure upon the occurrence of a given number of ERASE operations that will vary from manufacturer to manufacturer and from device to device, the described system tends to shorten the overall useful life of the devices within a FLASH memory system.

Accordingly, what is needed is a more effective and efficient way to reduce Read Disturb errors.

SUMMARY OF THE INVENTION

The disclosed embodiments are directed to methods and apparatuses for providing efficient detection and reduction of Read Disturb errors. In some embodiments, the methods and apparatuses involve a plurality of memory devices in a memory system, and a system controller configured to organize the memory devices into a plurality of blocks, each block having a plurality of pages, and each page defining an individually addressable physical memory location. Each memory device comprises a plurality of memory cells configured to store data received from a source external to the memory device. At least one of the memory devices further comprises at least one modified memory cell associated with the plurality of memory cells that is configured differently from the other cells (for example in terms of its construction, the voltages applied to the cell, or the manner in which it is utilized) so that this modified cell is more susceptible to a read disturb error than the other cells within the plurality of memory cells.

In some embodiments, the methods and apparatuses involve an apparatus for inhibiting and/or mitigating the severity of errors in a group of memory cells in a memory device. Such an apparatus may comprise at least one detecting cell having a floating gate transistor that is associated with the group of memory cells, and circuitry for applying a voltage to a gate of the detecting cell each time one of the memory cells within the group of memory cells is accessed as part of a READ operation. The apparatus may further comprise a sensor coupled to the detecting cell and adapted to sense a voltage or other electrical signal associated with the detecting cell that corresponds to the amount of charge stored on the floating gate of the transistor of the detecting cell. A comparator may also be coupled to the sensor and adapted to compare the sensed voltage or other electrical signal to a reference voltage or other reference electrical signal and provide an output, the output of the comparator generally providing an indication of increased likelihood of an error occurring within the group of memory cells.

In some embodiments, the methods and apparatuses involve a memory device comprising a memory space formed from a plurality of memory cells. The memory space contains physical address locations to which data may be stored, the physical address locations being grouped into Pages and at least one Block, where each Page comprises a plurality of physical address locations that are addressed at the same time and each Block comprises a collection of physical address locations that may be erased through a single erase operation. The memory device also comprises a detecting mechanism associated with at least one Block for providing an output signal (possibly a voltage) indicative of potential errors among the memory cells within the Block. The memory device further comprises means for receiving a READ request directed to a given Page within the Block and for providing a voltage to: (i) the memory cells in the Pages within the Block that are not the target of the READ request, and (ii) the detecting mechanism.

DETAILED DESCRIPTION

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Figure 1:
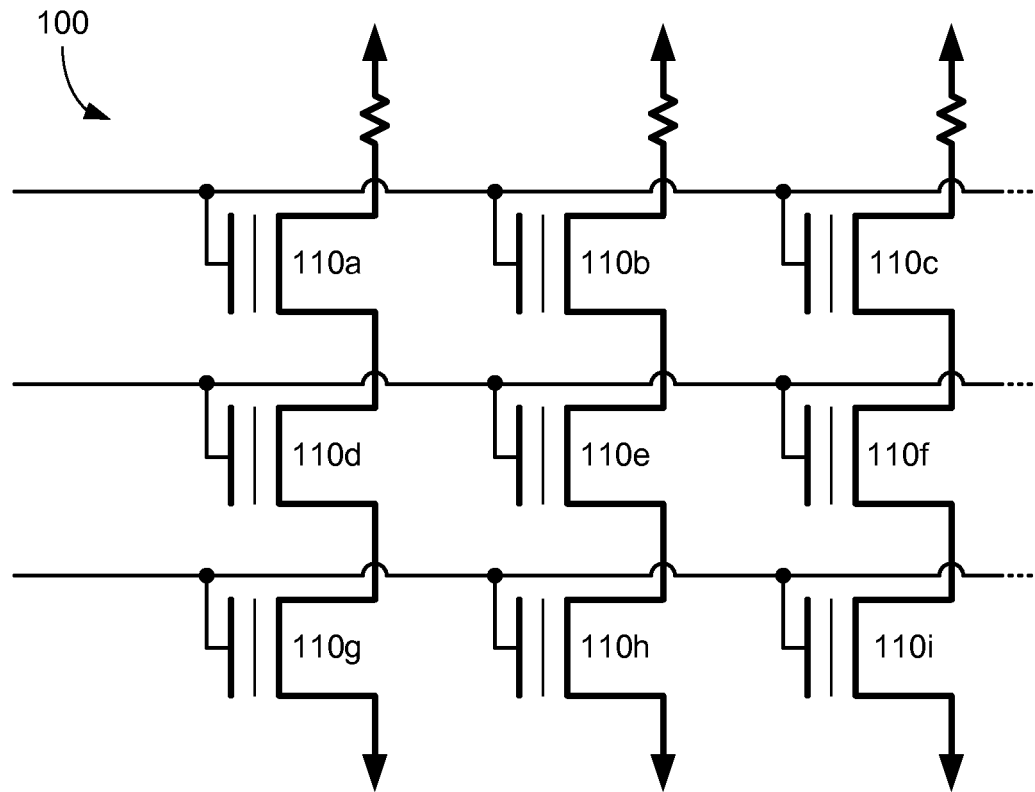
FIG. 1 generally illustrates a highly simplified memory.
Figure 2A:
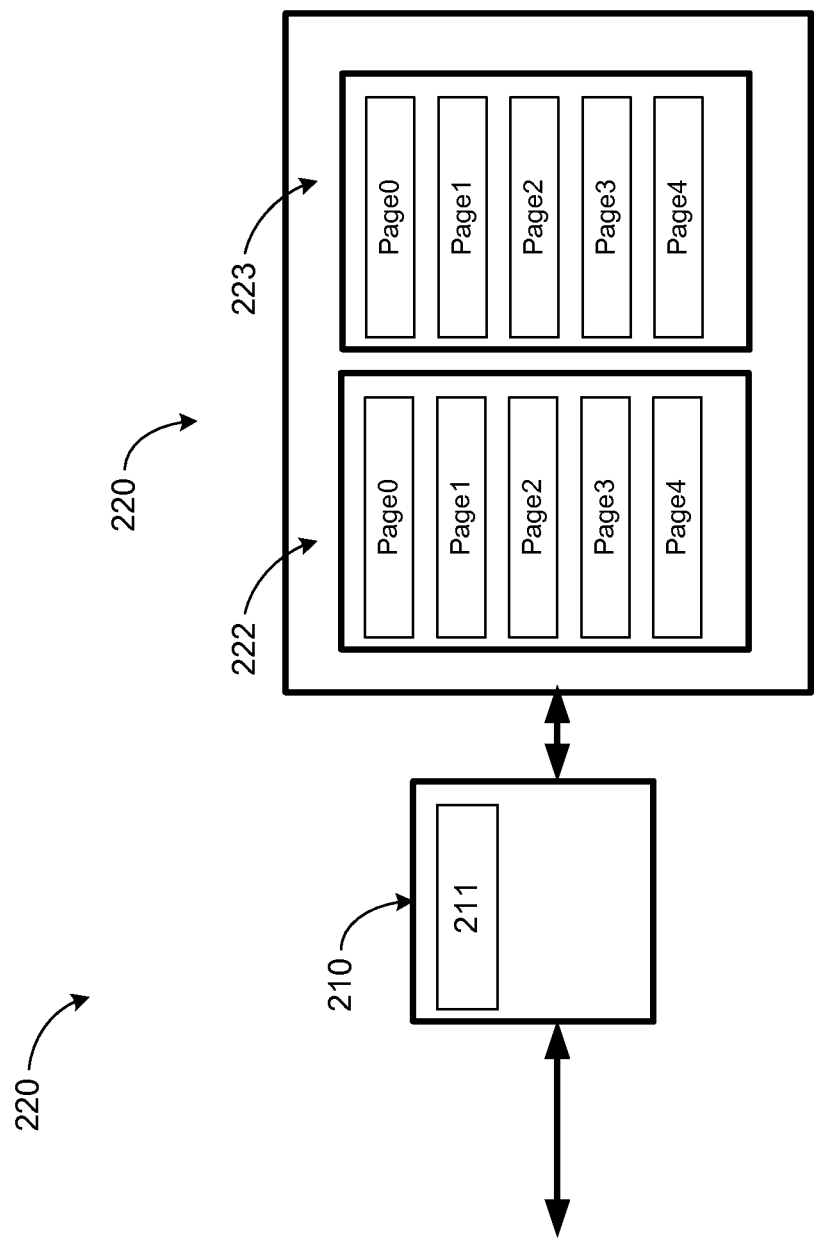
FIGS. 2A-2E generally illustrate an improved system and apparatus for reducing Read Disturb errors in memories.

Turning to the drawings and, in particular, to FIG. 2A, an improved system and apparatus 200 for reducing Read Disturb errors in NAND FLASH memories is illustrated.

In general, the disclosed system includes two main components: (i) a system controller 210 and (ii) a NAND FLASH memory array 220.

In a typical application, the system controller 210 will comprise a programmed processor, a field programmable gate array (FPGA), and/or a dedicated controller chip, and the NAND FLASH memory array 220 will comprise a number of individual FLASH memory devices arranged in a NAND architecture that includes a number of individual memory Blocks, with each memory Block including a number of Pages of memory. For purposes of illustration, only two Blocks 222 and 223 are illustrated, where Block 222 includes five Pages (Page0-Page4) and Block 223 includes five Pages (Page0-Page4). It should be clear that the disclosed subject matter is applicable to memories having alternate constructions.

The system controller 210 performs a variety of functions. Among the functions, the system controller 210 receives READ requests from an external device, not illustrated (such as a personal computer, server or the like) to read data stored in the FLASH memory array 220.

In the exemplary embodiment of FIG. 2, the READ requests will generally comprise a request to read the data within a given logical Page address associated with the FLASH memory system 200. Each logical Page address will be associated with a specific physical address within the FLASH memory array 220 through the use of a table maintained by the system controller 210. In general, the table will map each logical Page address to a physical Page address within the memory array 220. The use of logical Page addresses and a logical-to-physical Page address conversion allows the system controller 210 to manage effectively the memory within the storage array 220 and to implement various mapping and protection mechanisms, including the disclosed mechanism for reducing Read Disturb errors.

In the exemplary embodiment of FIG. 2, each physical Page within the memory array can be associated with a bit or group of bits used by the system controller to indicate whether the Page has an ERASED, VALID or DIRTY status. In general, an ERASED status means that all of the bits in the Page have been ERASED (which in the exemplary embodiment means set to a logic "0" level) and that the memory Page is in such a state that it can be programmed to receive data to be stored. The VALID status indicates that the Page contains valid stored data. The DIRTY status (which could simply be the presence of a logical "0" for a VALID bit) indicates that data associated with a logical address previously mapped to the DIRTY page has since been written to a different physical location (a VALID Page), thereby rendering the contents of the previous physical location invalid (DIRTY). It is important to note that, as discussed in more detail below, a Page having DIRTY status may be included in a Block that has other Pages having VALID status and, therefore, are storing valid data. It is also important to note that a DIRTY page may be included in an XOR reconstruction calculation if the DIRTY page is part of a Page Stripe that still contains one or more valid data pages.

In general, in response to a READ request, the system controller 210 will: (a) receive the request and the associated logical Page address; (b) determine the physical address associated with the logical address that is the subject of the request; (c) perform a READ operation on the device or devices within the FLASH memory array 220 corresponding to the identified physical address; (d) (optionally) perform an error correction or parity check on the read data to identify and, if necessary and possible, correct errors in the data; and (e) return the read data to the requesting device.

Although not particularly related to the subject matter of this disclosure, the system controller 210 is also capable of performing WRITE operations by receiving data—typically Page-aligned data (i.e., data that can be written into a Page or a Page Stripe (discussed below) on a Page-by-Page basis)—to be written to the device. Typically, the data to be written is accompanied by a logical address to which the data should be written. The system controller associates this logical address with a physical address within the FLASH memory array 220, returning a status for the write operation and updating any corresponding logical-to-physical address translation tables.

To provide enhanced Read Disturb error reduction, the system controller 210 of the system of FIG. 2A maintains, for each Block within the FLASH memory array 220, a counter that is used to maintain a count of the number of times the Block associated with the counter has been accessed through a READ operation since the last ERASE operation (or in an alternate embodiment, the last PROGRAM operation) for the Block associated with the counter. For purposes of illustration, a counter 211 is shown which is associated with Block 222.

The counter 211 may take many forms. It may be physically located within the same package as the controller 210 or, in an alternate embodiment, in the NAND FLASH memory array 220. It may be implemented directly through a hardware counter that is set to be reset each time an ERASE or PROGRAM operation is performed on the Block associated with the counter, or it can be implemented in software or firmware through an appropriately programmed processor, including the processor forming system controller 210. In the example, of FIG. 2, the counter 211 is illustrated as being implemented internal to the system controller 210.

In general operation, as READ operations are performed on Block 222 within the memory array 220, the system controller 210 monitors the count in the counter 211. When the system controller 210 determines that the Block count meets (or in some embodiments exceeds) a predetermined threshold number, it then takes steps that may ultimately result in the movement of one or more Pages of data within Block 222 to other memory locations so as to reduce the potential for Read Disturb errors arising in connection with the data stored in that Block.

In the illustrated embodiment of FIG. 2A, the steps implemented by the system controller 210 involve the movement of individual Pages of data from one Block to an alternate Block of FLASH memory upon the detection of a READ operation seeking access to that specific Page.

In this manner, Read Disturb errors are avoided by moving data from a Block that has been accessed a sufficiently large number of times that the potential for a Read Disturb error exists or is greater. However, because the data is moved on a Page-by-Page basis as Pages within the protected Block are accessed by a READ operation—as opposed to a wholesale move of all Pages within the protected Block—the overhead associated with the protection mechanism is limited, such that the overall performance impact on the overall memory system is minimal.

Figure 3A:
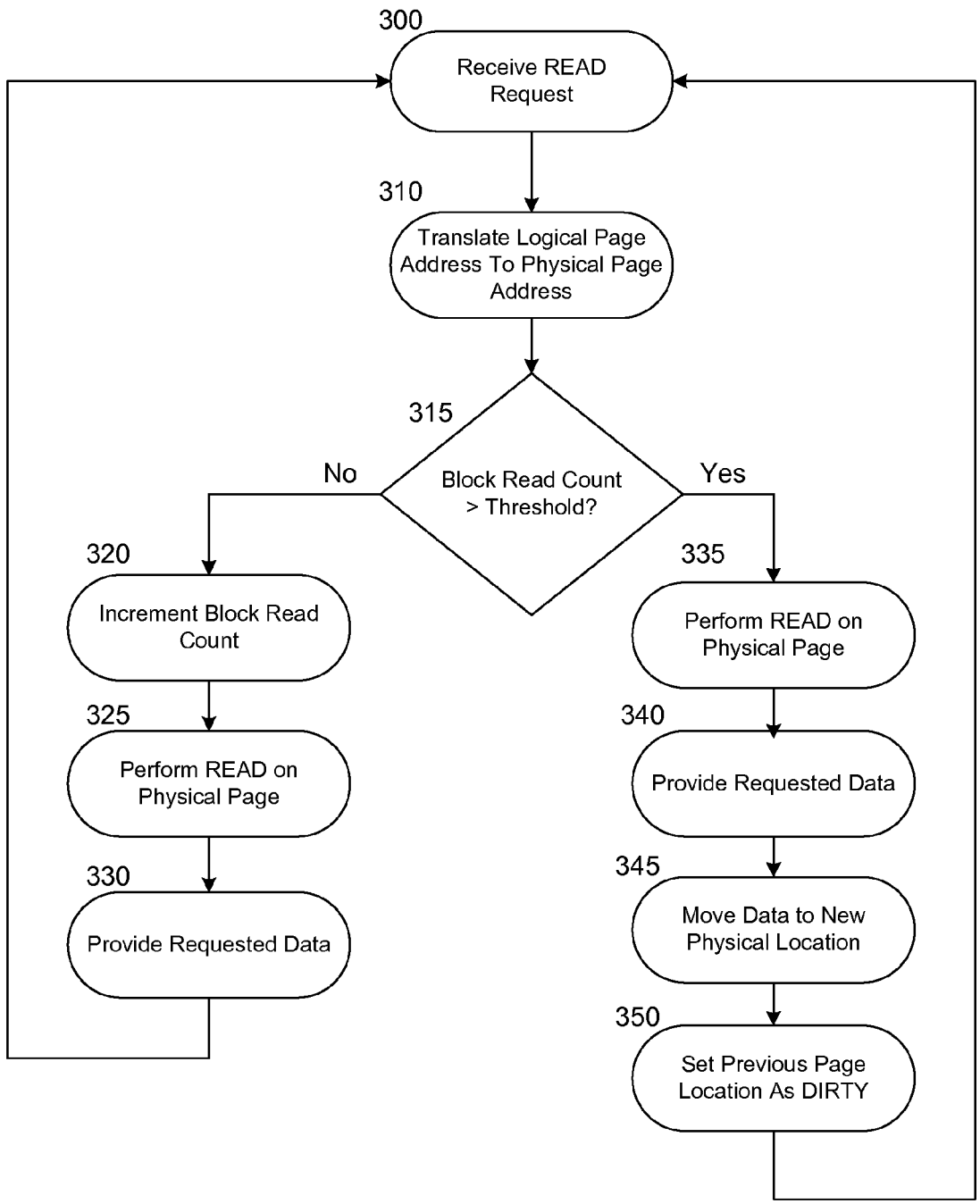
FIGS. 3A-3C generally illustrate a method for reducing Read Disturb errors that may be used with the system of FIGS. 2A-2E.

The general operation of the system controller 210 with respect to its monitoring of Block 222 is reflected in the chart provided as FIG. 3A. Referring to FIG. 3A, in normal operation, the system controller 210 will receive a READ access request from an external device in step 300. Although not illustrated, the step 300 may be preceded by an idle (i.e., wait for request) state. Because the READ access request will be seeking to read a Page through an associated logical Page address, the controller 210 will initially translate the logical Page address provided by the external device into a physical Page address of the memory array 220 in step 310. In this same step, the system controller 210 may also optionally implement access control policies to ensure that the access sought by the READ access request is permitted. It is also possible for the controller to generate its own internal read requests. These internal read requests may operate on specific physical addresses as well as logical addresses and may not, therefore, require a logical-to-physical address translation step.

Once the logical-to-physical Page address conversion has occurred, the controller 210 will then check whether the READ count for the Block in which the physical Page to be accessed resides is above the predetermined threshold limit for that Block at step 315. If the READ count for the Block to be accessed is at or below the predetermined threshold limit for that Block, the controller 210 will then increment the READ count for the Block at step 320, perform a READ operation on the physical Page corresponding to the requested logical Page at step 325, and provide the requested data to the device that issued the READ request at step 330.

If, however, it is determined in step 315 that the READ count for the Block containing the physical Page corresponding to the requested logical Page is above the predetermined threshold amount for that Block, the system controller 210 will then take steps to reduce the chance that a Read Disturb error will impact the data within Block 222.

If a READ operation is detected for a Page of data after the READ count for the Block in which the Page resides exceeds the threshold, the system controller 210 will first perform a READ operation on the physical Page at issue at step 335 and then, potentially after performing one or more error correction techniques (e.g., ECC) to verify the validity of the data, provide the requested data to the external device that made the READ request at step 340. The system controller 210 will then store the data from the Page that was read in a new Page of a different Block and then update the logical-to-physical address conversion table to indicate that the physical Page address associated with the logical address provided in step 300 is now associated with the physical address of the Page in the Block to which the data was moved at step 345.

After moving the data to the new physical location in a different Block, the system controller 210 will change the status for the Page in which the data was originally stored to DIRTY, as reflected by step 350.

In the method of FIG. 3A, it should be noted that the movement of data once the READ count for a given Page exceeds a predetermined threshold number is done on a Page-by-Page basis. Notably, when one Page of data is moved under this method, the other VALID Pages of data within the Block continue to be VALID and continue to be available for access. If, however, a subsequent read operation is attempted to a different Page within the Block at issue, the process will be repeated for the data within that Page (i.e., the data within the Page will be moved to a new physical location, the data within the accessed Page will be set as DIRTY, and the logical or virtual address for the moved data will be associated with the new physical address).

This aspect of the method of FIG. 3A may be better understood through reference to the example reflected in FIGS. 2B-2E.

Figure 2B:
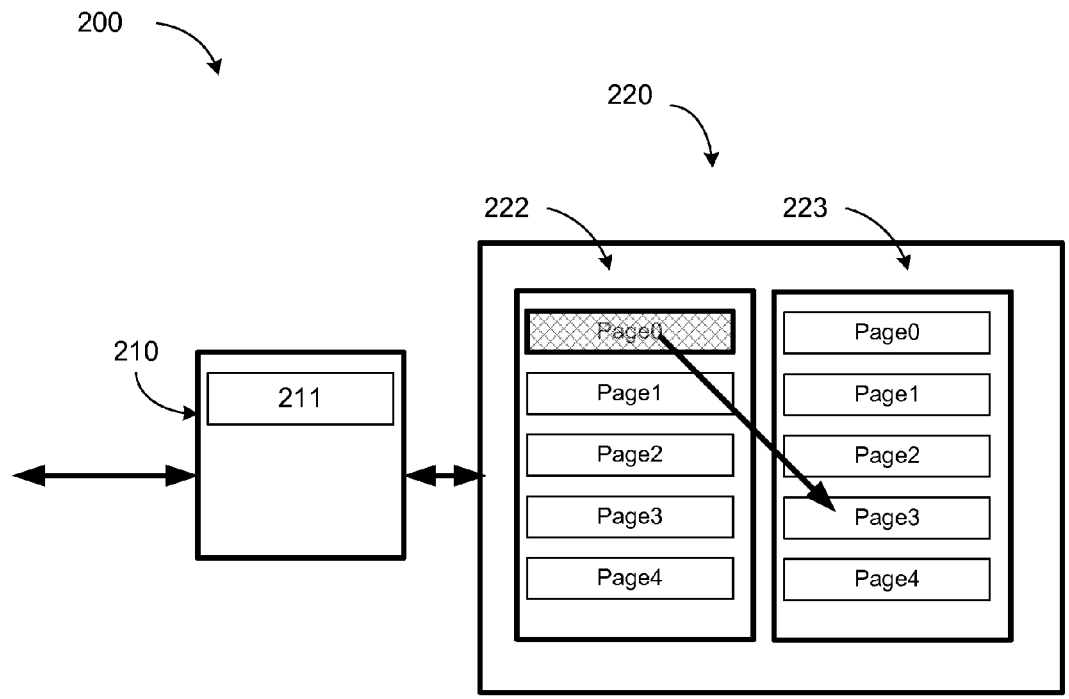

Referring to FIG. 2B it is assumed that a READ access attempt is initially requested for the logical address corresponding to a physical address at Page0 of Block 222 after the READ count for Block 222 has exceeded the predetermined threshold number set for Block 222. Following the method of FIG. 3A, this READ access will result in a movement of the data in Page0 of Block 222 to another Page in a different Block, which in the example of FIG. 2B is Page3 of Block 223.

Figure 2C:
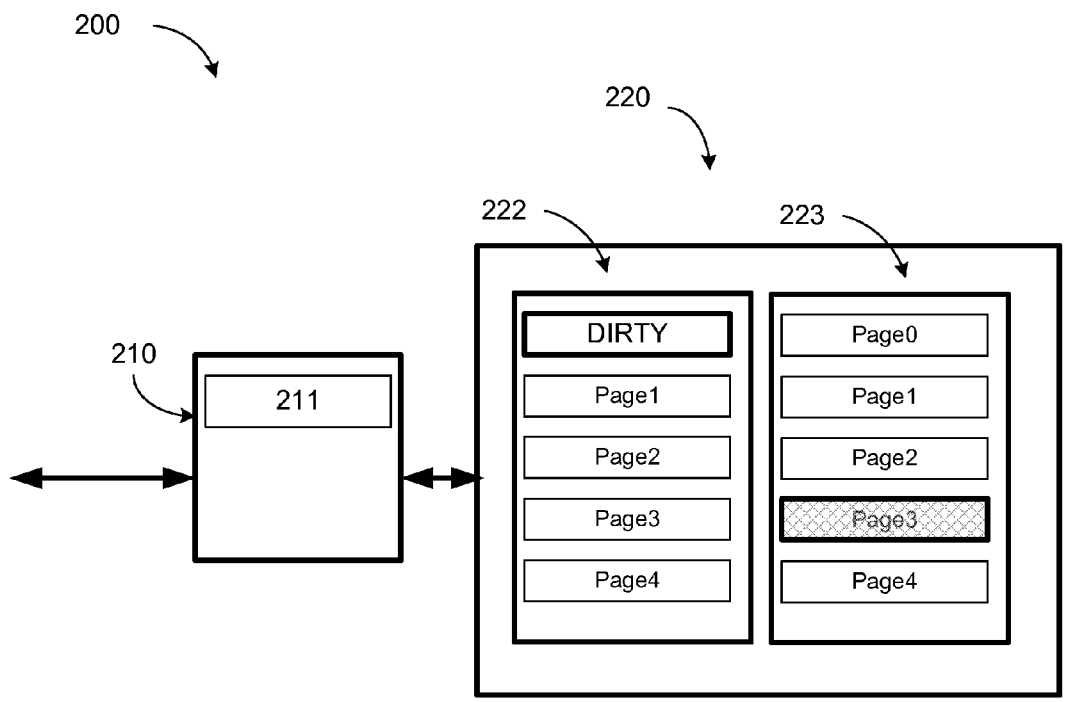

FIG. 2C illustrates the status of the memory array 220 after the move has occurred, where the data that was previously stored in Page0 of Block 222 is now shown as being stored in Page3 of Block 223, and where the data stored in Page0 of Block 222 is now shown as DIRTY. Notable, in this condition, only one Page of data has been moved, no ERASE operations have been performed, and the remaining Pages within Block 222 (i.e., Page1-Page4) continue to have a VALID status.

Figure 2D:
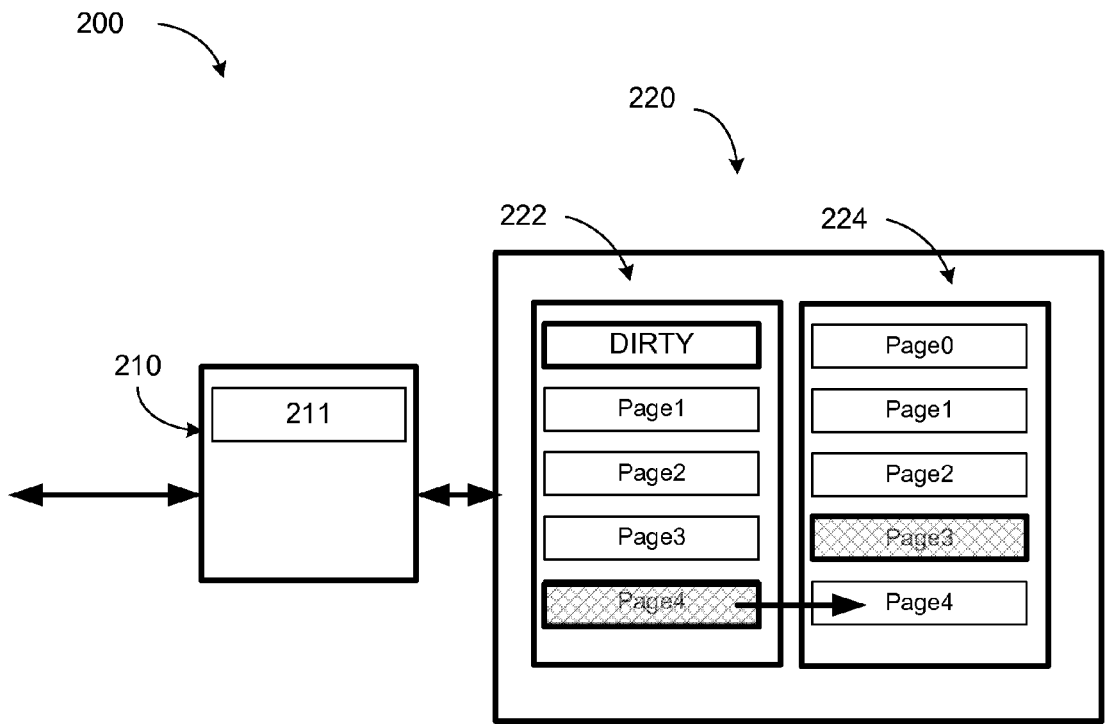
Figure 2E:
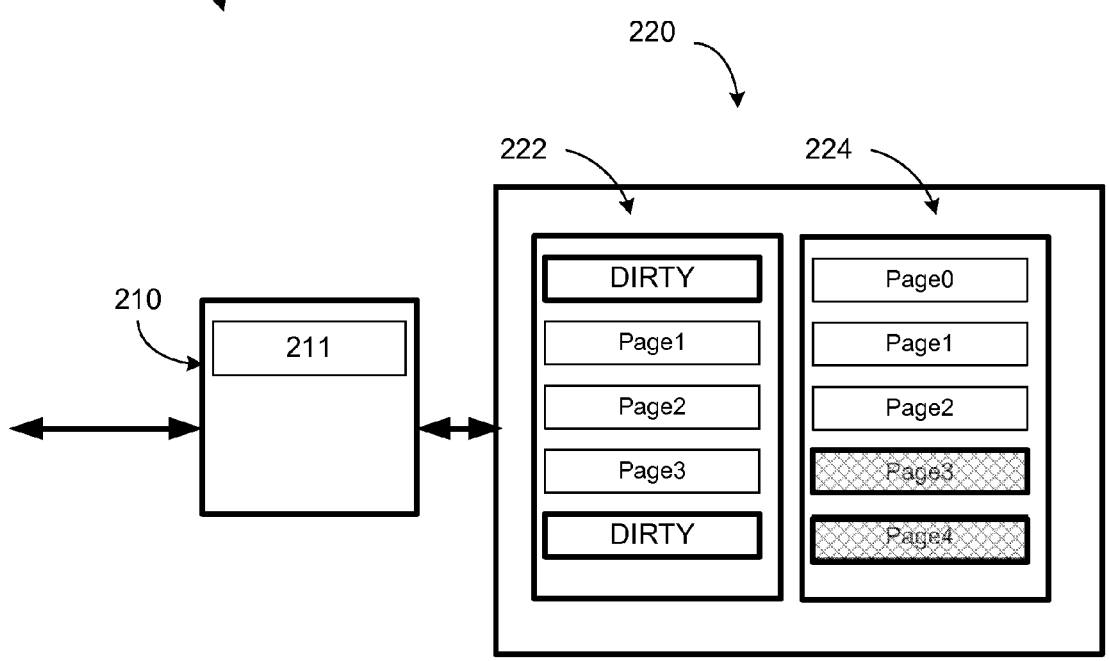

FIGS. 2D and 2E illustrate the operation of the method of FIG. 3A upon a subsequent attempt for READ access to data within Page4 of Block 222. Because, in the example, this READ access attempt will be after the READ count for Block 222 has exceeded the predetermined threshold number, the READ access will result in a movement of the data in Page 4 to a different Page, which, in the example, is Page4 of Block 223.

There are a number of ways in which the predetermined threshold numbers for the Blocks in memory array 220 can be determined. In accordance with one approach, the predetermined threshold number can be determined by considering manufacturer-provided data for a given type of FLASH memory device for the typical number of READ operations between data errors and setting the predetermined threshold number to be some percentage (such as, for example 60%) of that amount. A more advanced approach would be to actually test the various memory devices forming an array to characterize the individual devices to determine the average READ access operations between errors and set the threshold number as a certain percentage of that detected amount. If the selected threshold would exceed the manufacturer's specification for the number of reads guaranteed to be free from read disturbance, then a choice may be made to either base the threshold upon the manufacturer's specification (conservative operation) or to use the empirically determined limit (aggressive operation). The present disclosure is not limited to any specific approach for determining the predetermined threshold number, but rather encompasses all such methods.

Given a fixed read count threshold value, with the same value applied to all Blocks within a flash memory system, it is possible for a plurality of the Blocks to reach and/or exceed their thresholds at or near the same time. In such a scenario, a high percentage of subsequent read requests may require a corresponding move operation. Several approaches may be employed to alleviate this condition. One such approach involves initializing the read count for each Block to a small, possibly random, non-zero value, thereby causing the Blocks' thresholds to be reached after a slightly different number of read operations. This random number would not necessarily be the same number for each block, but could vary from Block to Block.

Another approach involves the use of two thresholds, a critical threshold and a lower-valued warning threshold. To prevent an abundance of move operations when multiple Blocks reach their respective thresholds, the system controller may respond to the lower-valued warning threshold by optionally moving the associated data so long as performance is minimally impacted, while still being required to move data upon reaching the higher-valued critical read count threshold. The general operation of the system controller 210 with respect to its monitoring of a Block in accordance with those alternative approach is reflected in the chart provided as FIG. 3B.

Figure 3B:
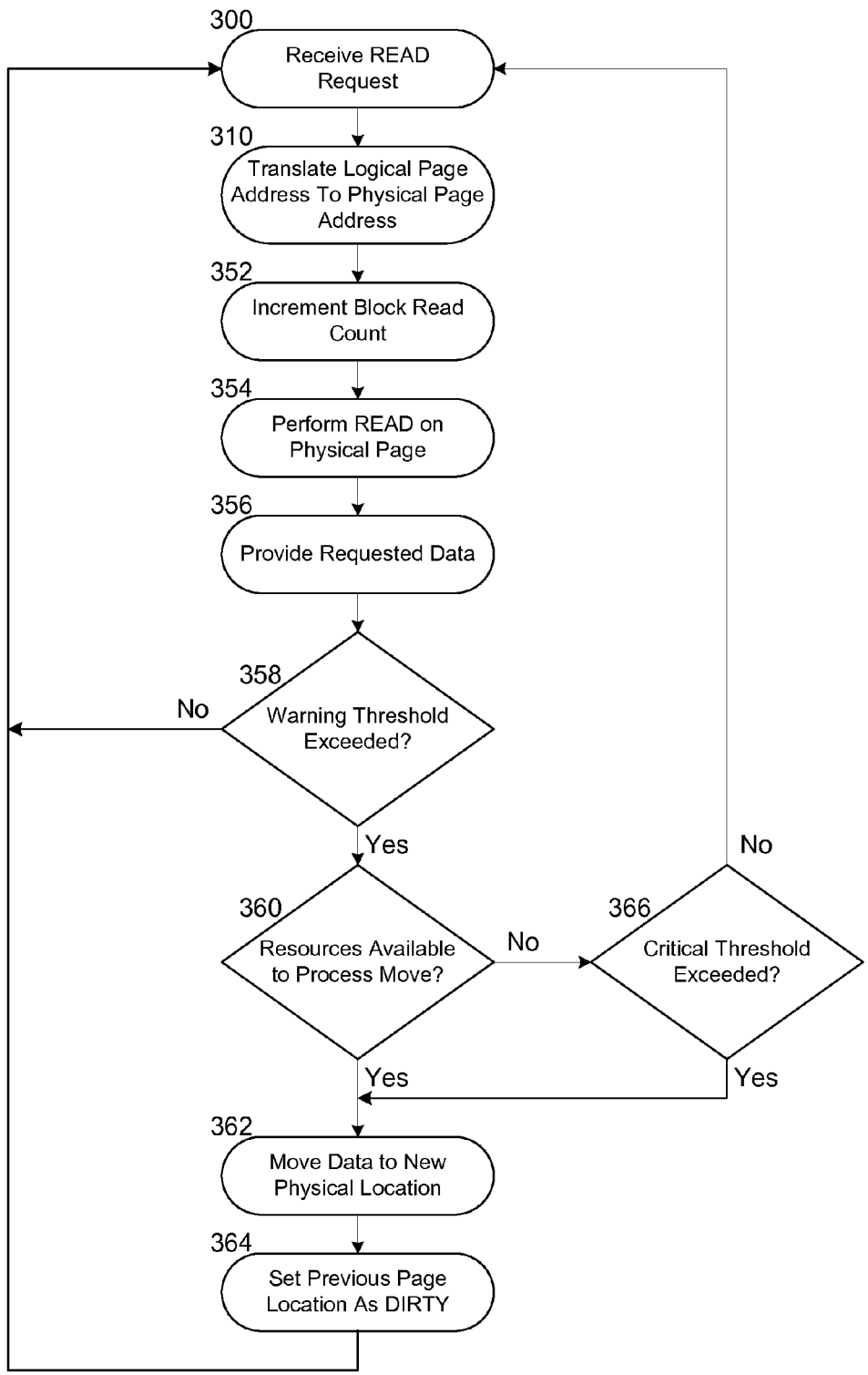

Referring to FIG. 3B, in normal operation, the system controller 210 will receive a READ access request from an external device in step 300. Because the READ access request will be seeking to read a Page through an associated logical Page address, the controller 210 will initially translate the logical Page address provided by the external device into a physical Page address of the memory array 220 in step 310. As with the process of FIG. 3A, in this same step, the system controller 210 may also optionally implement access control policies to ensure that the access sought by the READ access request is permitted. It is also possible for the controller to generate its own internal read requests. These internal read requests may operate on specific physical addresses as well as logical addresses and may not, therefore, require a logical-to-physical address translation step.

Once the logical-to-physical Page address conversion has occurred, the controller 210 will then increment the Block READ Count in step 352. Note that in the example of FIG. 3B the Block READ Count is incremented before the check is done to see if the Block READ Count exceeds one of the threshold numbers. This differs from the exemplary approach of FIG. 3A. Alternate embodiments of the approach of FIG. 3B are envisioned where the comparison is made before the Block READ Count is incremented.

After the Block READ Count is incremented in step 352, the data within the Page that was the subject of the READ request is read at step 354, any errors are identified and corrected and the data is provided at step 356. Then the Block READ Count is compared to a Warning Threshold at step 358. In this exemplary embodiment, the Warning Threshold is set to a number that is less than the threshold number at which it is deemed necessary to move a Page of data to avoid read disturb errors. In one exemplary embodiment, the Warning Threshold is set to be a number that is 100 less than the number that is believed to correspond to the threshold number where movement of the Page is required. For purposes of this method, the actual value of the Warning Threshold is not important as long as it is below that of the threshold at which a move operation is deemed necessary.

If the comparison at step 358 indicates that the Block READ Count is below the Warning Threshold number, then the system will return to step 300 and await another READ request for a page within the Block at issue.

If the comparison at step 358 indicates that the Block READ Count is above the Warning Threshold, then the controller will determine whether there are available resources to move the Page at issue at step 360. The determination of whether resources are available can be based on a number of factors including: (i) whether the system is in the process of moving another Page, Page Stripe or Block Stripe; (ii) whether the system is engaged in other overhead operations that are utilizing system resources; or (iii) whether there are other factors indicating that a move of the Page at issue would impair or unduly impact system performance. If the comparison at step 360 indicates that the resources are available to process the move, then the system controller will move the data within the Page to a new location at step 362, set the previously occupied Page location as DIRTY and return to step 300.

In one embodiment, the system maintains a list of Pages to be moved. The list may include only one entry or more than one entry. In this embodiment, the system may check at step 360 whether the list of Pages to move is full. If the list is full then it will be deemed that resources are not available to process a move. If the list is not full, then it will be deemed that there are resources available to process the move and the Page at issue will be placed in the list for a move operation.

If the comparison at step 360 indicates that resources are not available, then the system will determine at step 366 whether the Block READ Count exceeds the Critical Threshold value for that Block. As noted above, the Critical Threshold value may be set at the value corresponding to the number of READ operations to which the Block at issue may be subjected to before there is an appreciable risk of a read disturb error. If it is determined that the Block READ Count has exceeded the Critical Threshold, then the system will move the data for the Page at issue and set the previous location to DIRTY in steps 362 and 364 and return to step 300. If it is determined that the Critical Threshold has not been exceeded, then the system will return to step 300.

As may be noted, through implementation of the approach of FIG. 3B, the system can both ensure that a Page of data is moved before there is a high risk of a read disturb error through the use of the Critical Threshold value and allow Pages to be moved in a manner that optimizes overall system performance through the use of the Warning Threshold value.

A still further method involves the use of two thresholds, one that is used to determine the initial movement of a Page of data within a block and the other to determine the move of subsequent Pages. This method can be beneficial in situations where there is only one Page within a given block that is repeatedly accessed while the other pages are not accessed, or are not accessed at the same rate. This method is generally illustrated in FIG. 3C.

Figure 3C:
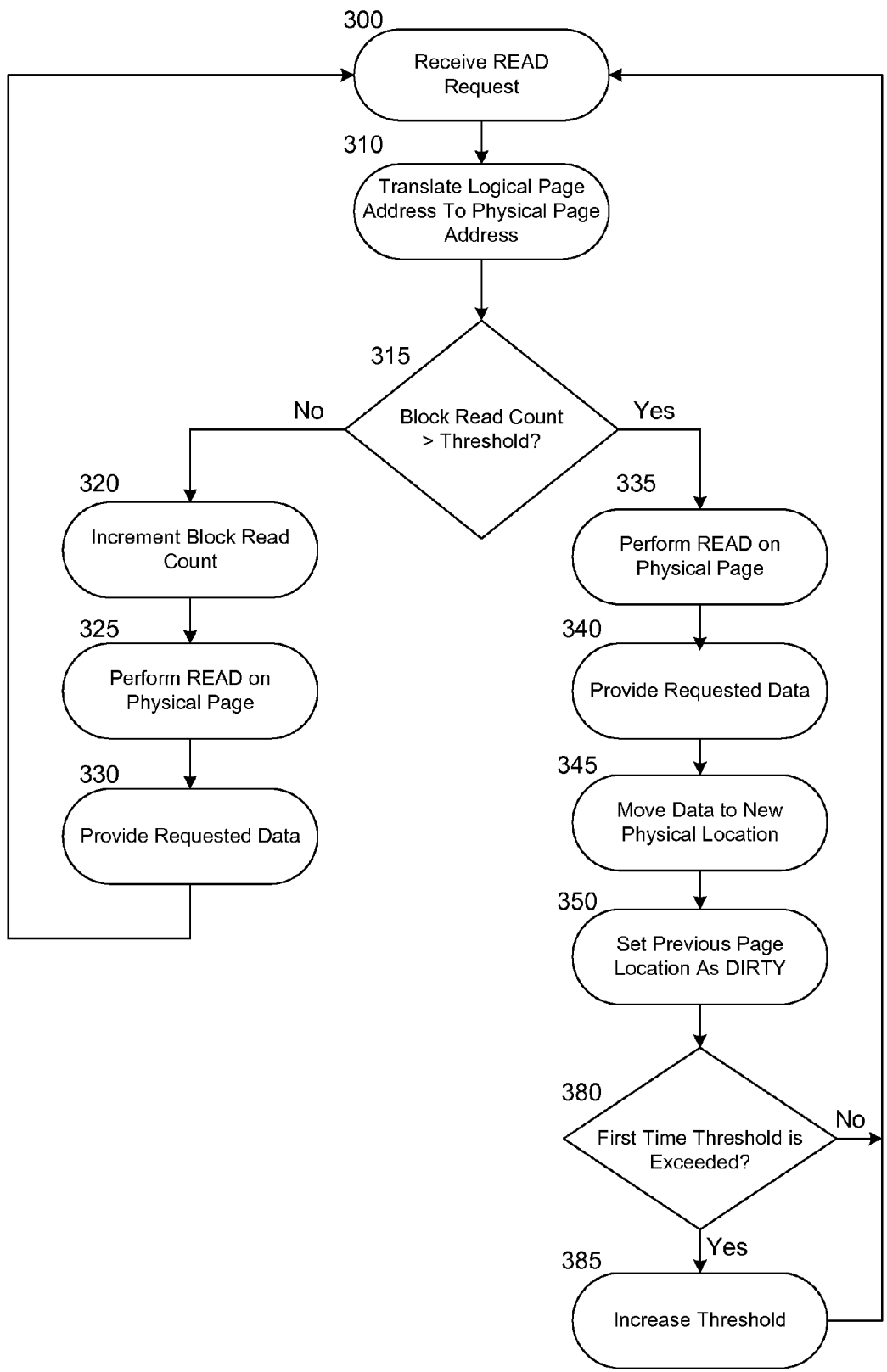

Referring to FIG. 3C, this alternative method operates substantially as described above in connection with FIG. 3A until the first time that the Block READ Count exceeds the initial threshold value for the block. Once it is determined that the initial threshold value has been exceeded for the first time at step 380, the threshold value will be increased at step 385 to a different value such that additional READ requests can be directed to the block before another Page is moved. In this alternative embodiment, the increased threshold value should be selected such that it is well below the number of READ operations that could give rise to a Read Disturb errors.

As may be noted, because the methods described in connection with FIGS. 3A-3C result only in the movement of a Page of data upon the detection of a READ access attempt for that Page, they impose significantly less overhead than systems in which entire Blocks of data are moved in an effort to reduce Read Disturb errors. Moreover, because the movement of data stored in a Page in the disclosed system and method occurs upon the detection of a READ access attempt for that Page, the disclosed systems and methods have the potential of dramatically reducing overall overhead.

The present disclosure is not limited to any specific mechanism for minimizing the performance impacts of utilizing a read count threshold algorithm, but rather encompasses all such methods.

It should be noted that the system and apparatus of FIGS. 2A-2E and the methods of FIGS. 3A-3C are exemplary only and changes can be made without departing from the teachings of the present disclosure. For example, the memory array 220 of FIGS. 2A-2E could have a larger number of Blocks than illustrated and/or a different number of Pages within each Block. The movement of two Pages from one Block to adjacent Pages on the same Block is not critical. The Pages could have otherwise been moved to non-adjacent Pages on the same Block or to Pages on different Blocks.

Similarly, the order of certain steps of the methods depicted in FIGS. 3A-3C could have been changed. For example, in the method of FIG. 3A, the requested data is provided to the requesting device in steps 335 before the data is moved to a Page in a different Block. It would be possible to move the data first, and then provide the data—through a READ operation of the new Page location—to the requesting device. As another example, in the method of FIG. 3A the READ count for the Block is incremented in step 320 before the actual READ access occurs in step 325. These operations could have been easily changed. As another example, in the method of FIG. 3A, step 315 determines whether the READ count for the Block at issue is above the predetermined threshold count for that Block. One could change that step to have the controller determine whether the READ count is equal to or above the threshold count without departing from the present teachings. Other changes, not discussed herein, can be made without departing from the teachings of this disclosure.

There are aspects of the system of FIG. 2A and the methods of FIGS. 3A-3C that are not explicitly illustrated, but that are beneficial to the implementation and practice of the disclosed systems and methods. For example, although not illustrated in FIGS. 3A-3C, the system controller 210 should generally have a method for resetting the READ count for the various Blocks upon the performance of an ERASE operation for the Block at issue or for initializing the READ count for the Blocks upon a defined event, such as an erase operation or other action.

In accordance with one embodiment of the present disclosure the system can manipulate the READ count values to beneficially address potential errors other than READ disturb errors. For example, it has been found that the data stored in a FLASH memory device is subject to corruption as a matter of time (e.g., as a result of the data being stored in a memory cell for a prolonged period of time) and/or as a result of some physically localized activity (e.g., a localized temperature change or radiation hit). These types of errors tend to impact not just one memory cell, but multiple memory cells in the same general physical location. Other types of "localized" errors are known, such as the failure of one or more components of a FLASH memory chip.

Because cells within a given Block are typically located physically close to one another, the methods and systems described above can be used to beneficially move data from physical locations that may be subject to localized (or other) errors. For example, in many FLASH memory systems, including the one described above, there are internal systems and methods utilized—such as ECC—to identify and correct errors that may occur within a given Page of data. If it is determined that a Page of data within a Block has an error, then the system controller can set the READ count for the block including that Page to a number that is at or above the threshold READ number (or the Critical Threshold Number, if warning and critical thresholds are used). Such a setting of the applicable threshold number will result in the other Pages within the block being moved the next time those Pages are accessed. Thus, potential errors in such Pages can be identified and, potentially, corrected during the move operation, thus minimizing the potential that uncorrectable errors will occur.

In some embodiments, the decision to set the READ count at or above the applicable threshold can be made on the occurrence of any identified error in a Page within a given Block. In other embodiments, the decision can be made upon the occurrence an error that can not be corrected through the use of the intra-Page ECC data. Still other embodiments are envisioned wherein the READ count is not adjusted until there are two (or some other predefined number of) errors or uncorrectable errors.

Because it has been determined that the presence of any errors within a Page of data may be an indication of a susceptibility to a Read Disturb error, a still alternate approach to addressing such errors would be to adjust the manner in which the Block READ Count is incremented in response to the detection of an error during a READ operation of a Page of data. For example, if a READ operation is performed on a given page and the data obtained from the page is not found to have an error, then the READ count for the Block containing the page can be incremented by one. If, however, the READ operation identified an error (such as an error correctable through the use of ECC) then the READ count can be incremented by two, twenty or some other number. Still further, if an uncorrectable error is identified, the READ count could be incremented by yet another amount. Such an approach will tend to cause the Pages within a Block associated with errors to be moved more rapidly than would occur if the READ count was incremented only based on the number of READ operations directed to the Block at issue. An alternate approach to achieving substantially the same result would be to adjust the threshold value for each Block based on the detection of errors within Pages in the Block.

For certain FLASH memory devices, to increase the performance of memory systems using FLASH memory devices, an underlying architecture is often employed in which the data in multiple FLASH memory devices is associated together to enable faster and more efficient access times and for enabling various error detection and error correction techniques. The systems and methods disclosed herein for reducing Read Disturb errors may be beneficially used in such systems.

Figure 4A:
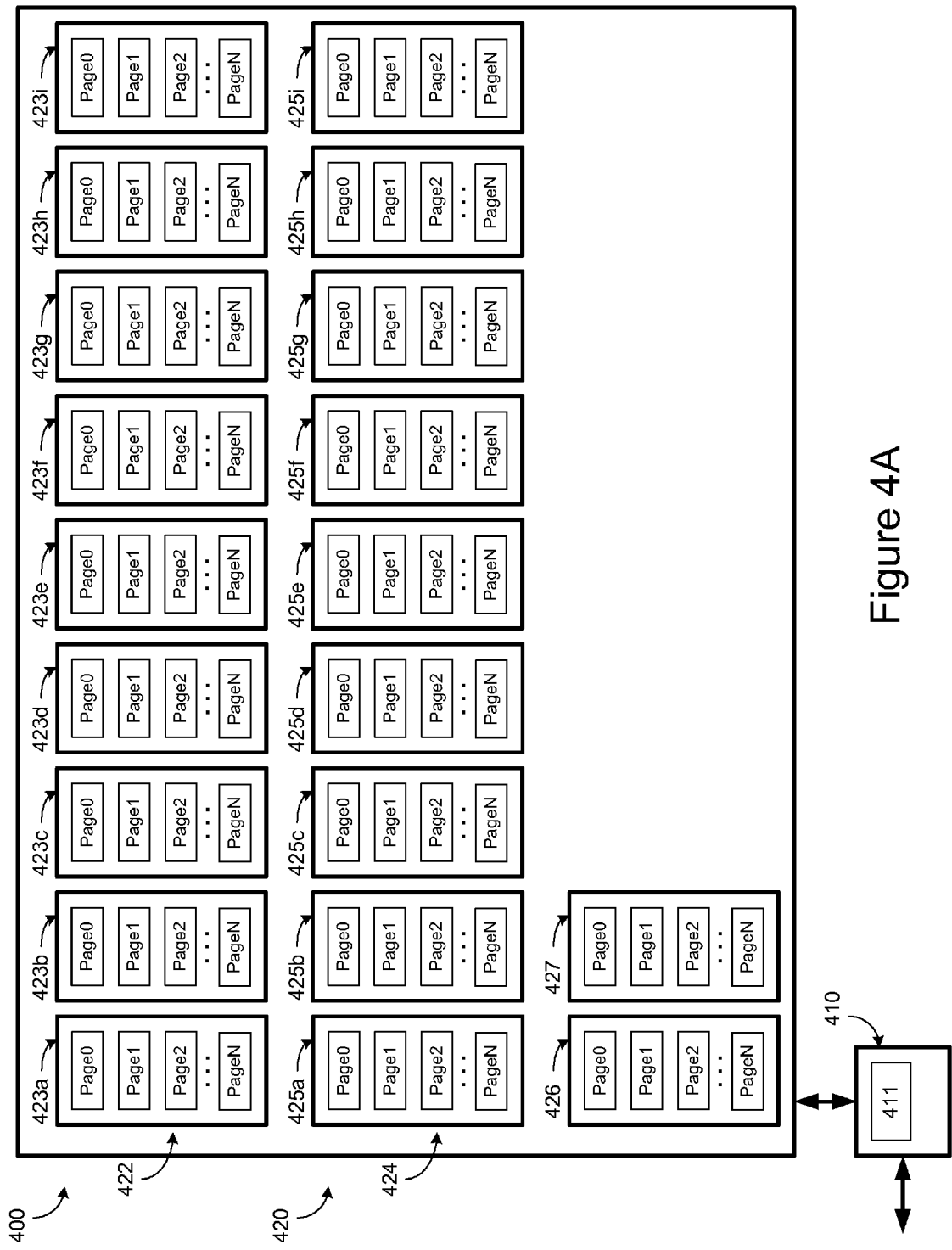
FIGS. 4A-4C generally illustrates an alternate system and apparatus for reducing Read Disturb errors in memories where data is stored and manipulated using Page Stripes.

FIG. 4A shows an alternative system 400 that, like the system of FIG. 2A includes a system controller 410 and a FLASH memory array 420. Like the memory array 220 of FIG. 2A, the memory array 420 of FIG. 4A includes a memory that comprises a number of Blocks with each Block including a plurality of Pages. In the illustrated example, there are twenty Blocks that have been divided into four groups, a first group 422 of nine Blocks, 423a-423i, a second group 424 of nine Blocks 425a-425i, a third group consisting of a single Block 426, and a fourth group consisting of a single Block 427. Each of the Blocks includes N+1 Pages, indexed 0 through N. For purposes of the following discussion, each grouping of Blocks 422 and 424 is referred to as a Block Stripe.

In the exemplary system of FIG. 4A, the data stored within corresponding Pages of the Blocks within a given Block Stripe (either 422 or 424) are related in the sense that when data is written to the memory system, the data is written in a "striped" manner. In other words, if data is to be written into the Pages within the Blocks in Block Stripe 422, the first Page of data will be written into the first Page (Page0) of the first Block 423a in Block Stripe 422, the second Page of data into the first Page (Page0) of the second Block 423b in Block Stripe 422, the third Page of data into the first Page (Page0) of the third Block 423c in Block Stripe 422, and so on until, assuming there is sufficient data to be written to memory, a portion of data is written into the first Page (Page0) of each of the nine Blocks 423a-423i. In the illustrated example of FIG. 4A, the portions of data stored in the same Pages of Blocks within a given Block Stripe are collectively referred to as a "Page Stripe."

In some embodiments, when data is written to or read from the memory system of FIG. 4A, the data is written or read on a Page Stripe basis. This increases the speed of a read or write operation in that, assuming that the Blocks that make up the Page Stripe are in different FLASH memory devices, the writing of the Pages of data that make up the Page Stripe can occur at or very nearly at the same time. Similarly, an attempt to sequentially access the Pages that make up a Page Stripe can be processed rapidly. For example, READ operations for the Pages of the data in the Page Stripe associated with the Page0 Page data within the Block Stripe 422 can be read simultaneously or near simultaneously from each of the Blocks that form Block Stripe 422.

In the embodiment of FIG. 4A, the Page entries within the third and fourth Blocks 426 and 427 are used to store data protection information that is associated with the Page Stripes stored in the other memory Blocks (which may take the form of XOR data for other Pages in the Page Stripe, error correction codes, CRC codes and/or parity codes). In one embodiment, such data protection information reflects, on a Page-by-Page basis, the bitwise exclusive—or (XOR) of the data in the other Pages associated with the Page Stripe. As an example, Page0 in Block 426 could be used to store data protection information (such as ECC data or other data) associated with the other data Pages in the Page0 Page Stripe within Block Stripe 422. In that example, data protection information for Page Stripes stored in the Block Stripe 424 could be stored in Block 427.

In addition to implementing the ECC technique discussed above, the embodiment of FIG. 4A takes steps to reduce Read Disturb errors associated with READ operations. In the illustrated example, this method is implemented in a manner similar to that described above in connection with the embodiment of FIGS. 1 and 2A-2E. However, unlike the embodiment of FIGS. 1 and 2A-2E, where the data is moved on a Page-by-Page basis to reduce Read Disturb errors, in the embodiment of FIG. 4, the data is moved on a Page Stripe-by-Page Stripe basis.

Figure 5:
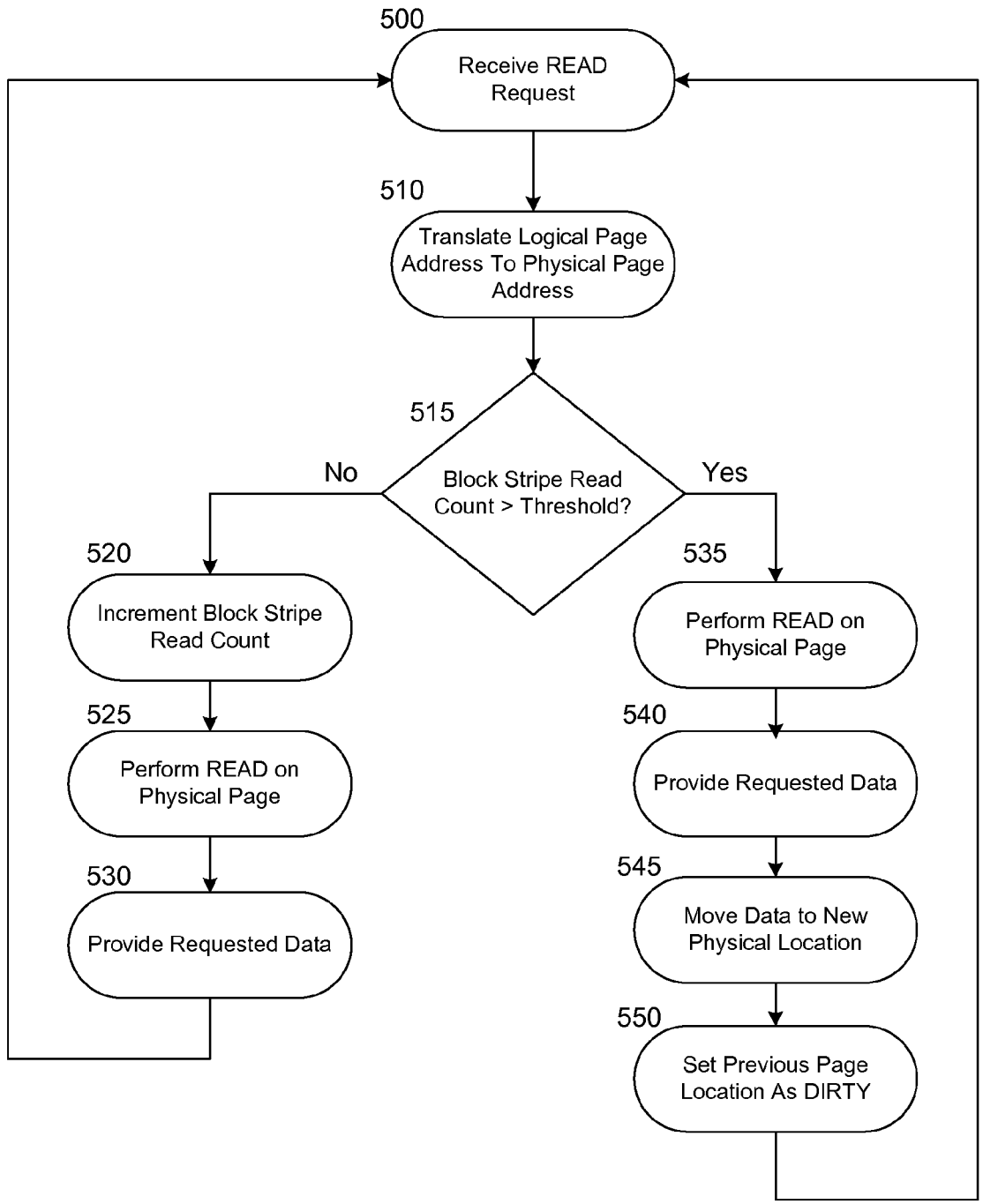
FIG. 5 generally illustrates a method for reducing Read Disturb errors that may be used with the system of FIGS. 4A-4C.

FIG. 5 generally illustrates the operation of the system controller of the embodiment for FIG. 4A. As with the embodiments of FIGS. 1 and 2A-2E, the system controller 410 will maintain a count of each time a READ operation is performed. However, because the READ operations in the embodiment of FIG. 4A generally occur across the Blocks that make up the Page Stripe (or on a Block Stripe basis), the system controller will maintain a count associated with the number of times a given Block Stripe has been subjected to a READ access since the last time the Block Stripe was subject to an ERASE operation. For purposes of this present discussion, a "Block Stripe" refers to the group of Blocks that are associated together to form one or more Page Stripes. When it is determined that the READ count for a given Block Stripe has exceeded (or reached in some embodiments) the predetermined threshold number for that Block Stripe, upon the next READ operation for a given Page in a Page Stripe stored in the Block Stripe (or the next READ of the entire Page Stripe), the system controller will move the data stored in the given Page Stripe to a new location. This movement is similar to that described above in connection with the movement of a single Page in the embodiments of FIGS. 1 and 2A-2E, but it occurs with respect to an entire Page Stripe.

Thus, generally, in normal operation, the system controller 410 will receive a READ access request from an external device in step 500. As the READ access request will be seeking to read a Page through an associated logical address, the controller 410 will initially translate the logical address provided by the external device into a physical address of the memory array 420 in step 510. Here, the system controller 410 may also optionally implement access control policies to ensure that the access sought by the READ access request is allowed.

After the logical-to-physical address conversion has occurred, the controller 410 will check whether the READ count for the Block Stripe in which the physical Page to be accessed resides is greater than the predetermined threshold limit for that Block Stripe at step 515. If the READ count for the Block Stripe to be accessed is at or below the predetermined threshold limit for that Block Stripe, the controller 410 will increment the READ count for the Block Stripe at step 520, perform a READ operation on the physical Page corresponding to the requested logical Page at step 525, and provide the requested data to the device that issued the READ request at step 530.

On the other hand, if it is determined in step 515 that the READ count for the Block Stripe containing the physical Page corresponding to the requested logical Page is above the predetermined threshold amount for that Block Stripe, the system controller 410 will then take steps to reduce the chance that a Read Disturb error will impact the data within the Block Stripe (for example, Block Stripe 422).

If a READ operation is detected for a Page after the READ count for the Block Stripe in which the Page Stripe resides exceeds the threshold, the system controller 410 will first perform a READ operation on the physical Page at issue at step 535 and then, potentially after performing one or more error correction techniques (e.g., ECC) to verify the validity of the data, provide the requested data to the external device that made the READ request at step 540. The system controller 410 will then store all or part of the data from the Page Stripe that was read in a new Page Stripe in a different Block Stripe and then update the logical-to-physical address conversion table to indicate that the physical address associated with the logical address provided in step 500 is now associated with the physical address of the Page Stripe in the Block Stripe to which the data was moved at step 545.

After moving the data to the new physical location in a different Block Stripe, the system controller 410 will change the status for the Page Stripe in which the data was originally stored to DIRTY, as reflected by step 550.

In one embodiment, whenever a given Page of data within a Page Stripe is read, all of the data Pages within the Page Stripe are read and the data is either made available internally or provided external to the memory storage system. In this embodiment, the steps described above in connection with FIG. 5 can generally be performed on a Page Stripe basis, rather than on a Page basis. In such an embodiment, however, the page of data protection data within a Page Stripe need not be read and made available each time the Page Stripe is read and could be accessed only if the access of the pages containing stored data reveal an error or failure that can not be corrected by intra-page ECC.

In one embodiment, only the Pages of the Page Stripe that contained stored data from an external device are moved when a move operation is implemented in step 500. In such an embodiment, the Page of the Page Stripe containing data protection data is not necessarily moved since the Page containing the data protection data is not necessarily accessed each time a data Page within the Page Stripe (or multiple data Pages within the Page Stripe) are read.

Figure 4B:
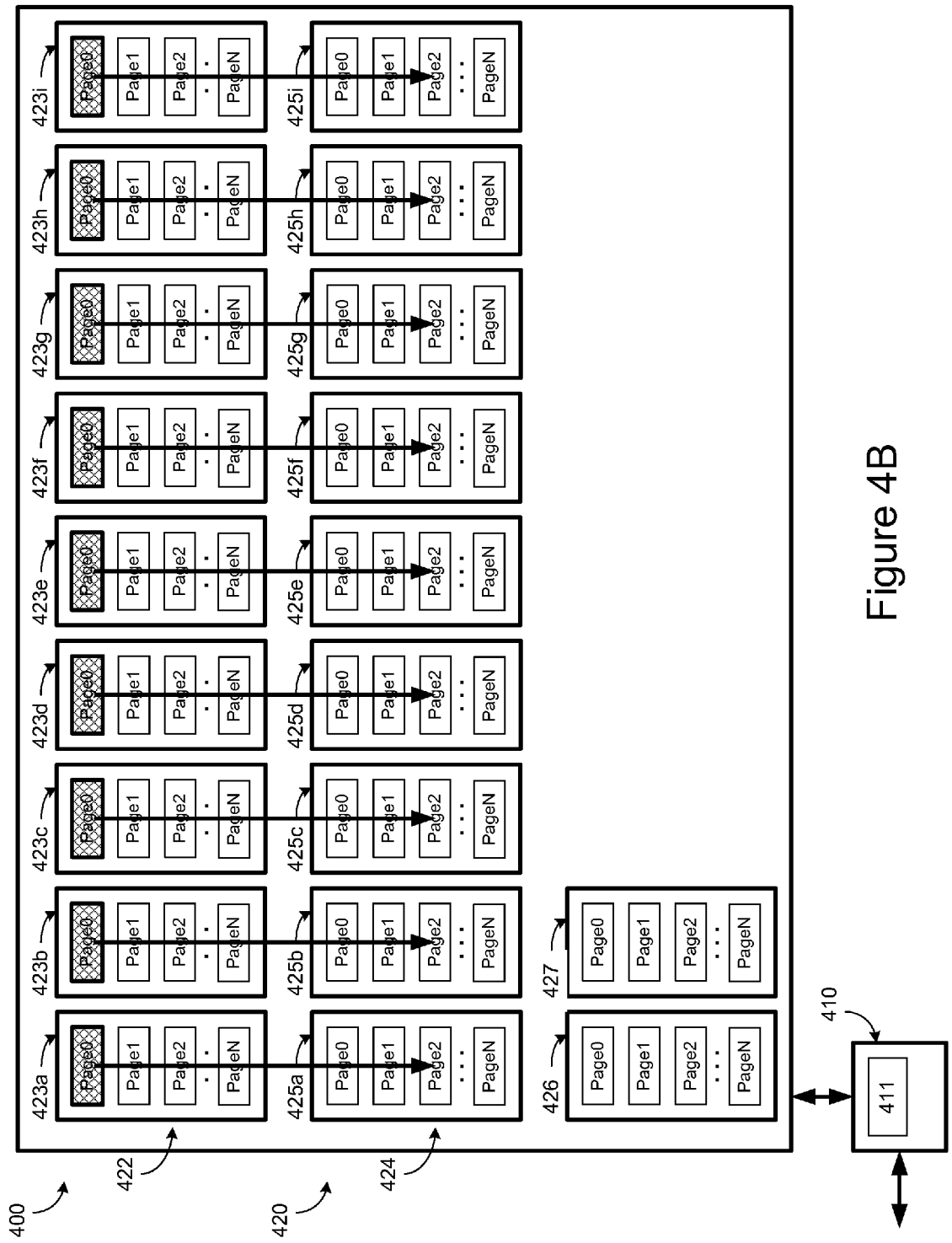
Figure 4C:
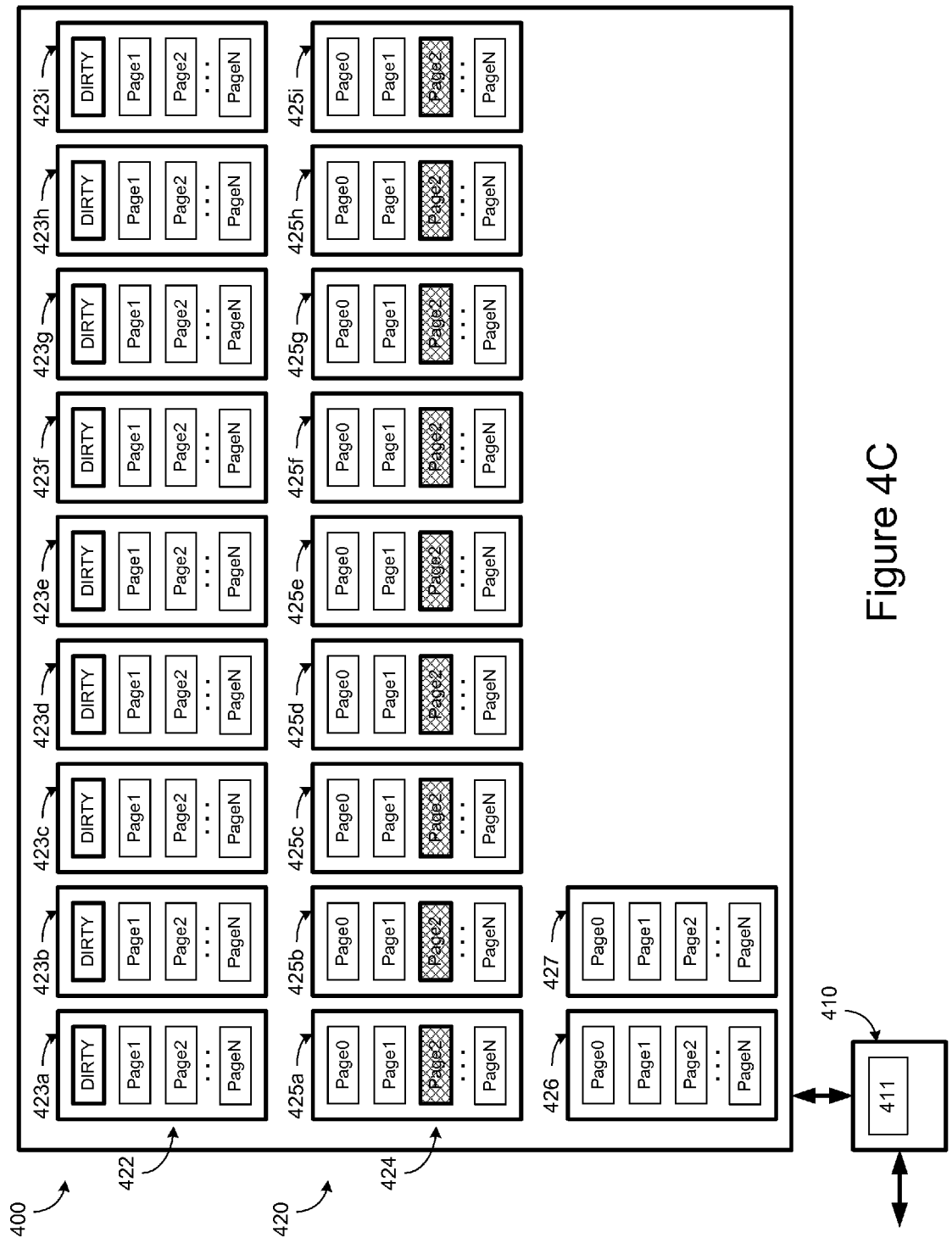

The movement of a Page Stripe in accordance with the system of FIG. 4A and the method of FIG. 5 is reflected in FIGS. 4B-4C. The same general process is followed as with the movement of the Pages describe in connection with FIGS. 2A-2C and 3, except that: (i) the entire Page Stripe that is moved, (ii) the logical addresses for all of the Pages in the Page Stripe are remapped to new physical addresses, and all of the Pages where the Page Stripe data was previously stored are set as DIRTY. In the example shown in FIG. 4B-4C, the data in the Page Stripe made of the first Page (Page0) of each Block in Block Stripe 422 has been moved to the Page Stripe made of the third Page (Page2) of each Block in Block Stripe 424. Movement of other Page Stripes may be accomplished in a similar manner and are therefore not expressly illustrated here for economy of the description. While this approach may add some additional overhead not associated with the embodiment of FIGS. 2A-2C and 3, it allows for the manipulation of data on a Page Stripe-by-Page Stripe basis, which is desirable in certain applications.

In the embodiment of FIGS. 4A-4C and 5, the system controller 210 maintains a separate map that associates each Page Stripe with a Page of data protection data that, for the Page Stripes originally in Block Stripe 422 is stored in the Pages of Block 426. As noted above, in the illustrated embodiment, the data within the Block 426 is not necessarily moved each time the data in its associated Page Stripe is moved. However, alternate embodiments are envisioned where the data in the ECC/parity Block is moved along with its associated Page Stripe.

It should be appreciated that the various alternative approaches described above in connection with systems operating on a Page basis, including but not limited to the approaches illustrated in FIGS. 3A-3C, can be implemented on a Page Stripe or Block Stripe basis.

Figure 6A:
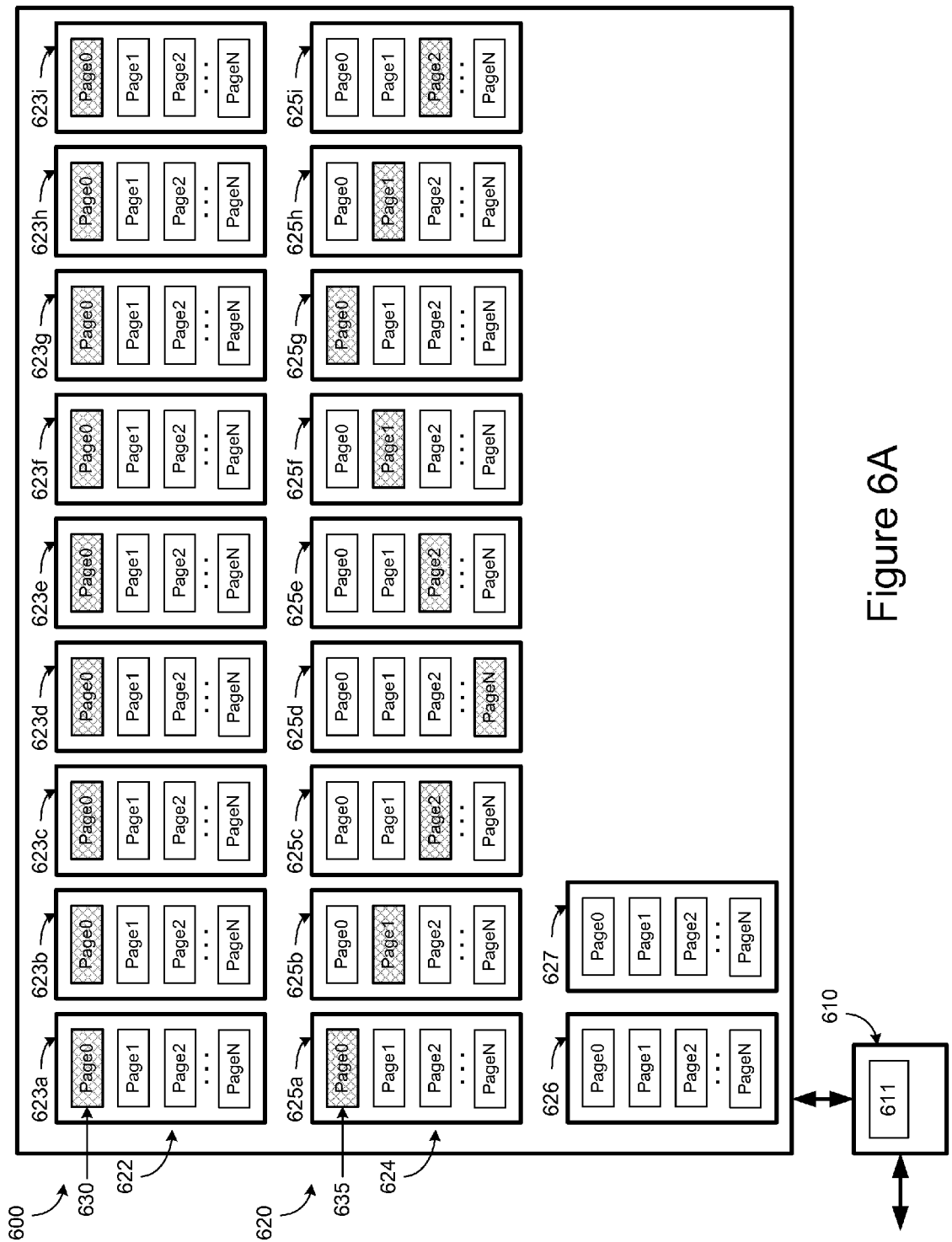
FIGS. 6A and 6B illustrate an alternate approach for reducing Read Disturb errors in systems using Page Stripes through the storage of the data comprising the Page Stripes in different physical locations in the Blocks in which that data is stored.

A further embodiment for reducing Read Disturb errors in applications utilizing Page Stripes is reflected in FIG. 6A. FIG. 6A illustrates a memory system 600 that, like the system of FIGS. 4A-4C and 5, stores data across a plurality of Pages and a plurality of Blocks utilizing Page Stripes. In the embodiment of FIG. 6A, however, the data for a given Page Stripe is not stored in the same Page location in each Block of the Block Stripe in which the Page stripe data is stored. Instead, the data for a given Page stripe is such that the positions of the Pages associated with the Page stripe intentionally vary from Block to Block, at least for multiple Blocks in which the Page Stripe is stored. This implementation can be beneficial in preventing unrecoverable Read Disturb errors since it appears that the sensitivity of a memory cell to a Read Disturb error is associated with its physical position within a Block. Accordingly, using the approach of FIG. 6A and distributing the Pages comprising the Page Stripe across different physical locations within the Blocks making up the Block Stripe where the Page Stripe is stored, the number of Read Disturb errors that can not be corrected through ECC is reduced.

In FIG. 6A, the locations of the Pages making up two exemplary Page Stripes 630 and 635 are illustrated (see highlighted Pages). Page Stripe 630 is shown as being in the Block Stripe 622 and is shown as having all of the Pages in the Page Stripe residing at the Page0 locations of their respective Blocks.

Page Stripe 635, illustrated as being in Block Stripe 624, is shown as having the Page locations of its Page Stripe vary across the Block Stripe. As noted above, this approach is advantageous in reducing the conditions under which Read Disturb errors occur.

Figure 6B:
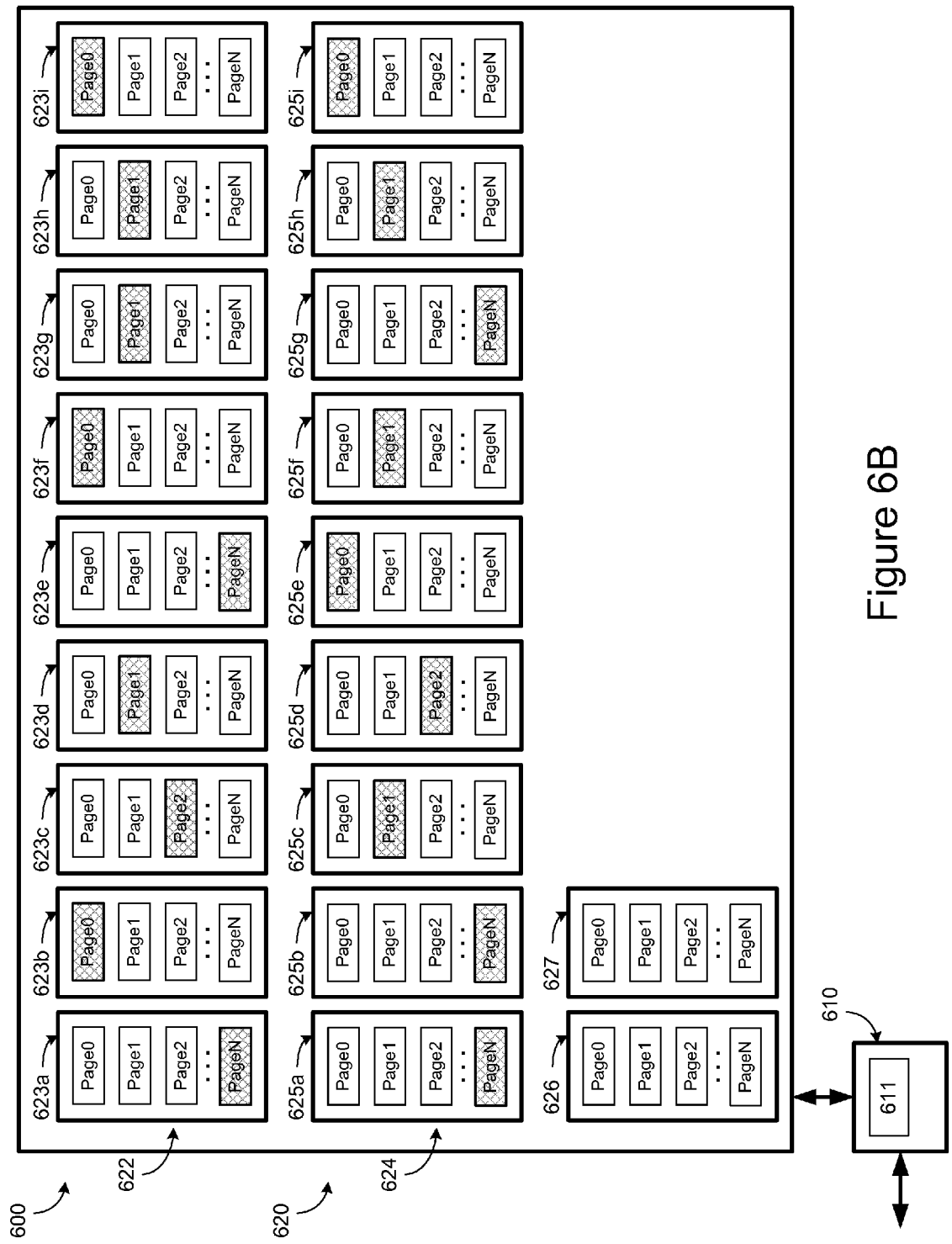

The precise Page location of the Pages with a Page Stripe using the technique under description is not critical. FIG. 6B illustrates examples of two Page Stripes (one in each of Block Groups 622 and 624) where the Page locations for the Pages within the Page Stripe vary.

In the embodiment of FIGS. 6A and 6B it should be noted that there should be some mechanism, for example a set of tables maintained by a system controller 610, that includes information that identifies, for each Page Stripe, which Pages are associated with that Page Stripe.

This beneficial attributes of the embodiment of FIGS. 6A and 6B exist independently of any other mechanisms for Read Disturb reduction. The system of FIGS. 6A and 6B, however, may be combined with one of the methods of FIG. 3 or 5 (or a variant thereof) to provide even further Read Disturb protection.

The embodiments described above with respect to FIGS. 2-6B concern approaches for storing and moving data in an effort to reduce Read Disturb errors or unrecoverable Read Disturb errors. Alternate approaches based on physical nature of the FLASH memory devices could be used.

Figure 7A:
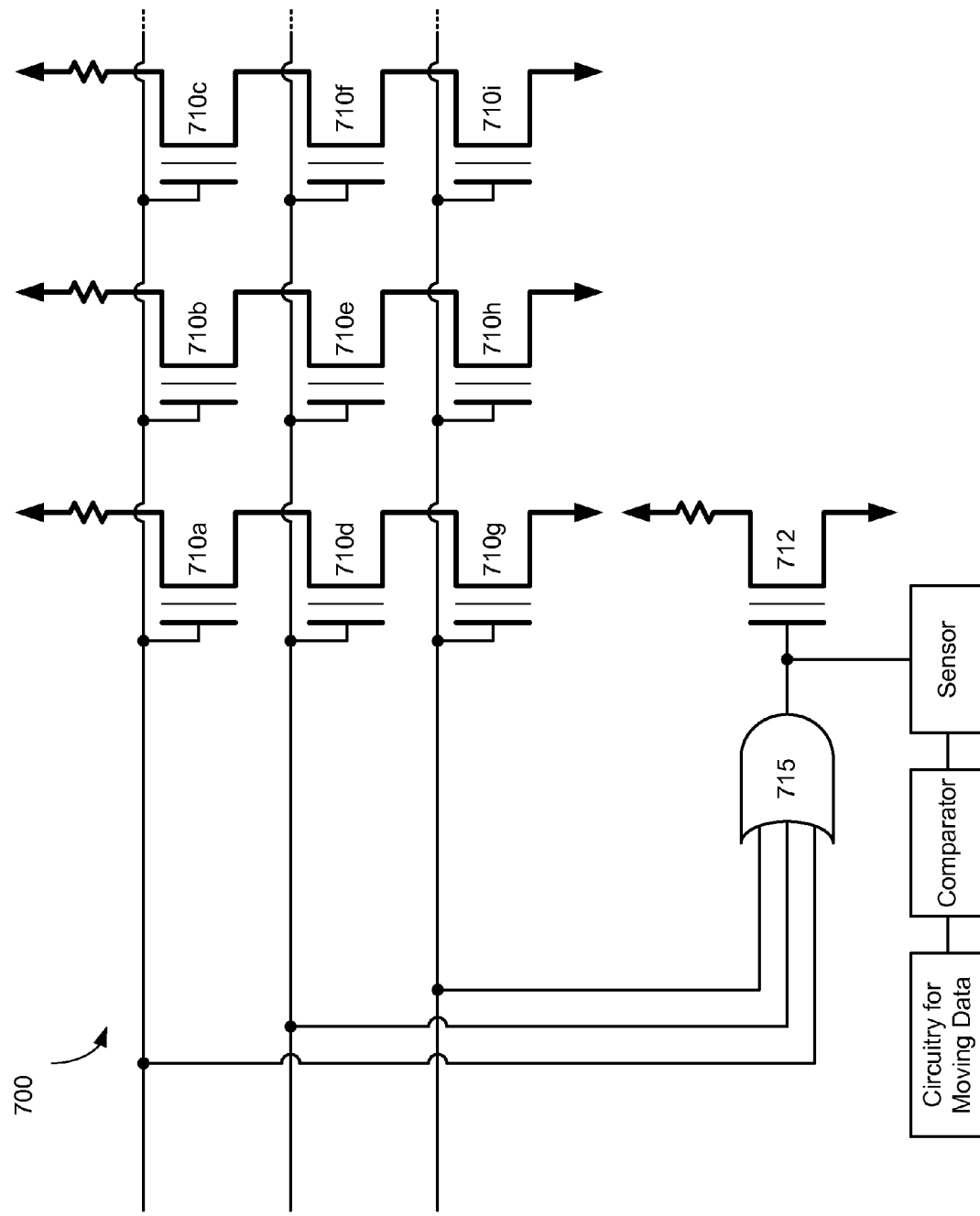
FIGS. 7A-7C illustrate an approach using modified or extra storage cells to detect conditions conducive to Read Disturb errors.

FIG. 7A illustrates an exemplary embodiment of a highly simplified FLASH memory Block 700. The general construction of this simplified array is similar to that discussed above with respect to FIG. 1 insofar as a NAND FLASH memory 700 includes nine memory cells 710a-710i, arranged in a three-by-three array. As before, cells using a floating gate construction are used for purposes of illustration. From top to bottom, the cells are coupled together in series to form what is sometimes called a bit line. For example, cells 710a, 710d and 710g are coupled together in series to form a bit line. The illustrated Block 700, however, includes an additional modified memory cell 712. In the embodiment of FIG. 7A, the additional modified memory cell 712 and the control circuitry 715 associated with it is arranged such that the memory cell is, either at or just after the performance of an ERASE operation on the Block 700, placed on a low charge state. The cell 712 and the associated circuitry 715 are further configured such that a voltage is applied to the gate of cell 712 each time a READ operation is performed on any of the Pages within the Block 712. The voltage applied during such a read operation is, in one embodiment, the same voltage that is applied to the gates of the transistors associated with the Page that is not being read during a READ operation.

In the embodiment of FIG. 7A, the modified memory cell 712 is constructed in a manner physically different from those of the devices forming the standard memory cells 710a-i and in such a way that it is more susceptible to having induced Read Disturb errors. As one example, a floating gate of the modified memory cell 712 could be constructed such that its physical location and/or size, relative to the other transistor components within the cell, differs from the equivalent characteristics of a standard cell so that charge migration into the floating gate is enhanced relative to the charge migration experienced by a standard cell under identical operating conditions. Alternatively, the conductive or dielectric nature of the material separating the floating gate from the main gate could be adjust to promote charge migration. Still further approaches can be used wherein the modified memory cell is identical in physical construction to the standard memory cells, but where the voltages applied to the modified cell, for example if the cell is a floating gate transistor, the voltages applied to the drain, source, gate and/or the bias voltages, are such as to make it more susceptible to Read Disturb errors. Regardless of the method in which it is constructed, the intention is to ensure that the modified memory cell 712 is constructed and utilized in such a way that it collects and retains charge that is incurred as a result of the stresses imposed upon it by a READ operation at a rate and level greater than that of the standard memory cells 710a-i.

Because it collects charge more rapidly than the standard memory cells, the modified memory cell 712 can act as a specialized "detecting" cell.

In one embodiment, the detecting cell is (or the detecting cells are) erased at the same time as the memory cells associated with the detecting cell(s) such that the detection of charge migration for the detecting cell(s) will begin from the same low or no charge state as the memory cells associated with the detecting cell(s). A comparator circuit (not illustrated) may then be provided to compare the charge from the modified memory cell 712 to a reference voltage and/or to determine whether the modified memory cell exhibits characteristics associated with a Read Disturb error. Circuitry, generally illustrated in FIG. 7A as an OR gate 715, combines the read signals from the standard memory cells 710a-i. The output of circuitry 715 is then connected to the gate of the modified cell 712 so that a read signal is also applied to the modified cell 712 whenever a read signal is applied to one of the standard memory cells 710a-i. By performing a simulated READ operation on the modified cell 712 each time a READ operation occurs for the Block associated with the modified cell 712, and monitoring the output from the modified cell 712, one can identify the onset of conditions conducive to a Read Disturb error. In other words, the transition of the logical state associated with the modified cell from that associated with a no or low charge state to that associated with a high charge state will indicate the existence within the Block of conditions conducive to a Read Disturb error. This indication can then trigger a process, either internal or external to the flash chip, by which data within the Block is moved, either in toto or on a Page-access by Page-access basis as described above.

In embodiments where the modified cell 712 is configured to be more susceptible to read disturb errors than the standard cells, the gate voltage applied to the modified cell each time a READ operation occurs in connection with one of the standard cells can be set so that the modified cell is configured to be more susceptible to a read disturb error than the standard cells. For example, in one embodiment, the gate voltage applied to the modified cell 712 in such circumstances could be greater than the voltage applied to the gates of the standard cells that are not the target of a READ operation. In yet another alternative embodiment, the same voltages could be applied to the modified cell 712 that are applied to the standard cells, but the voltage could be applied to the modified cell 712 for a greater length of time. In such an embodiment, the application of the gate voltage to the modified cell for the greater time period would make charge accumulation in the modified cell 712 more likely than in the standard cells, thus configuring it to be more susceptible to a read disturb error. The various voltages or voltage durations can be applied through configuration of the OR gate 715 or through the use of other circuitry (not illustrated)

Figure 7B:
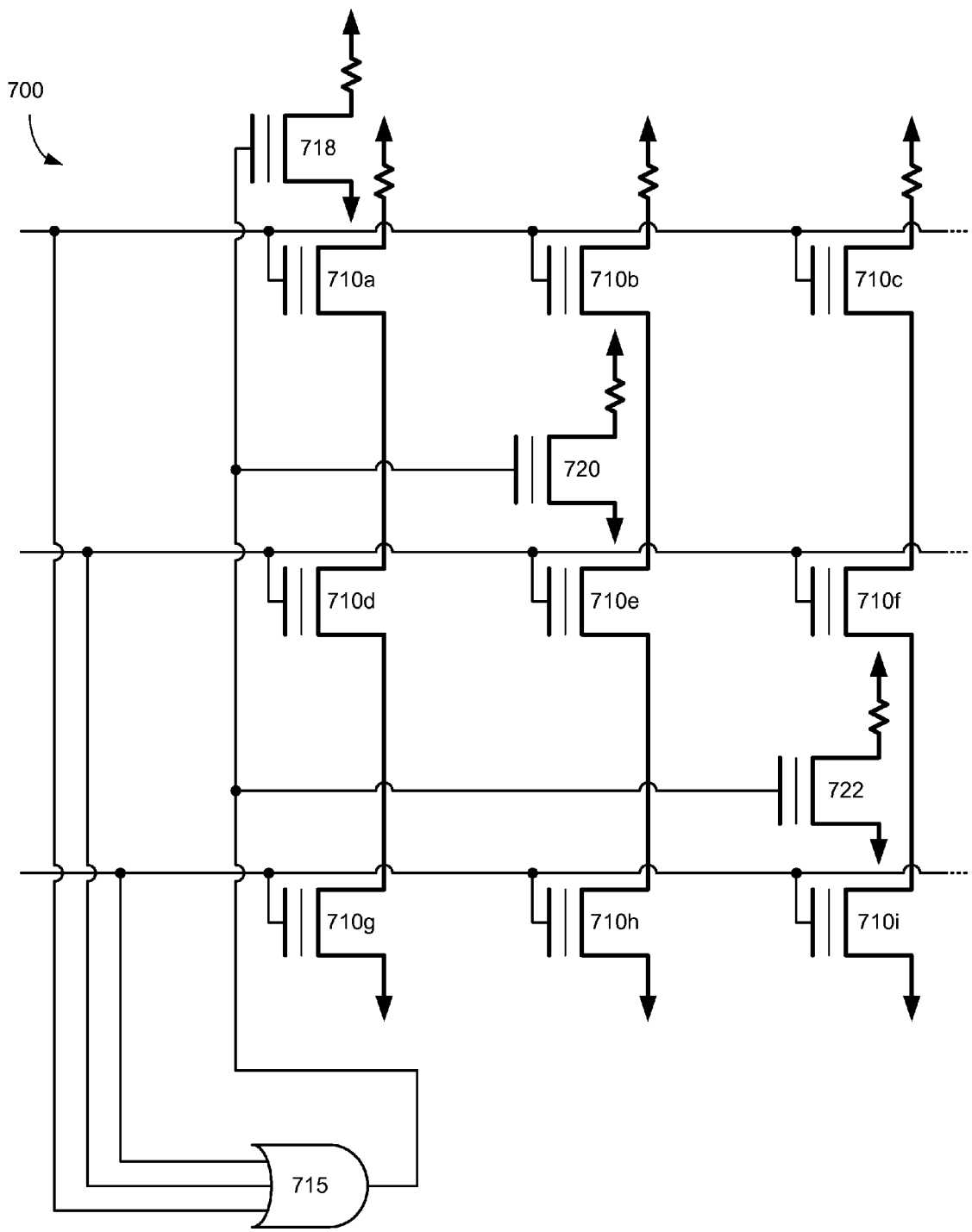

Alternate embodiments are envisioned in which more than one modified cell is provided for each Block. Such cells may be located at various physical positions within the Block. For example, FIG. 7B illustrates a simplified example where three modified storage cells 718, 720, and 722 are provided at three discrete locations within the Block. The system of FIG. 7B operates in a similar manner to the system described in FIG. 7A. In this embodiment, each of the modified cells 718, 720, and 722 will be subject to the application of a READ gate voltage as described above. Whenever the reading from a given modified cell (718, 720, 722) indicates that the conditions for a Read Disturb error exist, the entire Block of Pages could be moved or, in some embodiments, only those Pages physically proximate to the modified storage cell reflective of such conditions will be moved, or subject to moving on a Page-by-Page basis. For example, if the modified storage cell 720 reflected that conditions conducive to a Read Disturb error existed, but the modified storage cells 718 and 722 did not reflect those conditions, only the data in the Page or Pages near the modified storage cell 720 (the Page with cells 710d, 710e and 710f in the example shown) would be subject to moving. The data in other Pages within the Block would be allowed to retain their positions until the modified cells proximate to the Pages where that data is stored indicate conditions prone to Read Disturb errors.

Figure 7C:
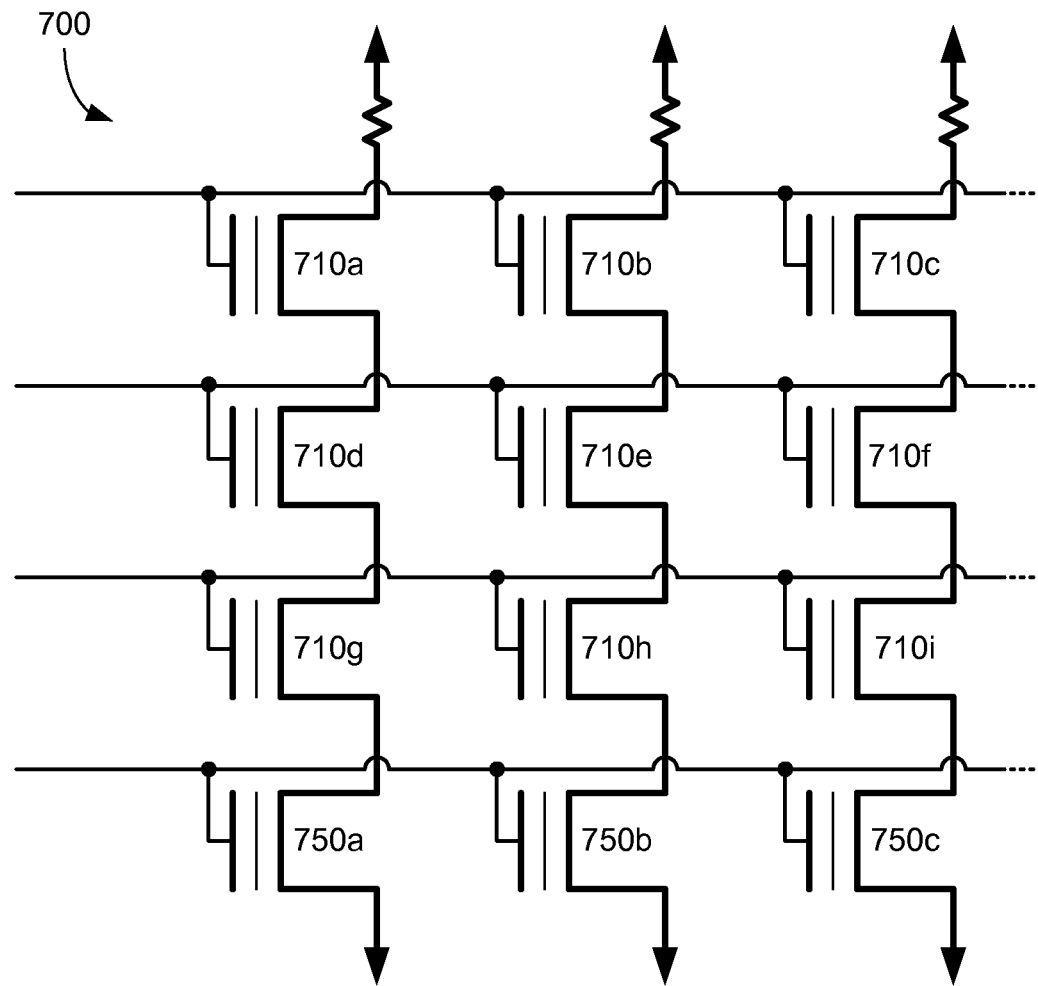

In yet another embodiment, illustrated in FIG. 7C, an extra cell is added to each bit line in the flash memory Block 700. These extra cells 750a-750c could be added to each bit line, or to any subset of the bit lines within a Block. These added cells could be modified cells, designed specifically to yield an early warning of impending read disturb errors, or they could be nominally identical to the other standard cells within the Block. For the case in which the cells are nominally identical to standard cells, post-production testing could be performed to identify a specific cell within the bit line which would generally be most susceptible to read disturbance. This more susceptible cell could then be used as a detector to give an early warning of impending read disturb failures within the bit line. Regardless of the manner in which the early warning cells are selected, the end result is a mechanism for the early detection of impending read disturb errors, just as in the previous embodiments.

The above embodiments are illustrative and not limiting. Other and further embodiments utilizing one or more aspects of the inventions described above can be devised without departing from the spirit of Applicant's invention. For example, instead of making the modified storage cells discussed above in connection with FIGS. 7A and 7B more susceptible to Read Disturb errors through physical modification, they could be made more prone to such errors through modifying the electrical signals provided to the cells in terms of, for example, raising the gate voltage applied during a read operation or adjusting the bias voltages applied to the transistor within the cell. Further, the various methods and embodiments discussed above can be included in combination with each other to produce variations of the disclosed methods and embodiments. Thus, one could use a READ count for a given Block of data as described in the methods of FIGS. 3 and/or 5 along with a modified cell as described in FIGS. 7A and 7B. Discussion of singular elements can include plural elements and vice-versa.

Still further, the above examples discuss the utilization of sensed voltage signals to detect conditions indicative of a potential read disturb error. Other sensed characteristic, such as a sensed current value, a sensed electrical field, or some other sensed signal could be used. Still further combinations of such sensed characteristics can be used. In such embodiments, the sensed characteristic or characteristics can generally correspond to the amount of charge that has accumulated in the modified (or detector) cell.

Further, the order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions. Still further any type of NAND FLASH memory (including SLC and MLC) memory can be used.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants. Applicants intend to fully protect all such modifications and improvements that come within the scope or range of equivalent of the following claims.

What is claimed is:

1. A memory device comprising:
   a plurality of memory cells configured to store data received from a source external to the memory device, the plurality of memory cells organized into a plurality of blocks, each block comprising an N×M array of memory cells, each column of the N×M array defining a bitline, the N×M array forming a plurality of pages, and each page defining an individually addressable physical memory location;
   at least one modified memory cell associated with each block, the at least one modified memory cell configured in such a manner that it is more susceptible to a read disturb error than the plurality of memory cells;
   a controller operatively coupled to the memory cells and configured to:
   access a logical-to-physical translation table that associates a logical address provided in a Write request with a physical address corresponding to a page within a first block;
   accumulate a Block Read Count corresponding to the number of times any of the memory cells in the first block, including at least one modified memory cell associated with the first block, have been read; and
   respond to a plurality of Read requests for pages within the first block received after the Block Read Count has reached a predetermined number and no read disturb error has been detected for the at least one modified memory cell associated with the first block, such response comprising:
   moving data associated with a requested page to a page in a second block that is different from the first block, without moving data associated with other pages in the first block to a different block; and
   modifying the logical-to-physical translation table to associate the moved data with the physical address of the page in the second block.

2. The memory device of claim 1, wherein each of the plurality of memory cells and the modified memory cell includes a floating gate transistor, and wherein the memory device further comprises circuitry for applying a voltage to a gate of the modified memory cell when a voltage is applied to a gate of at least one of the plurality of memory cells.

3. The memory device of claim 2 wherein voltages are applied to the gates of the plurality of memory cells and the modified memory cell during a Read operation, wherein the voltages that are applied to the gates of the plurality of memory cells will vary depending on whether the memory cell is being read during the Read operation.

4. The memory device of claim 3 wherein the voltage applied to the gate of the modified memory cell during a Read operation is greater than the voltage applied to the gate of one of the plurality of memory cells that is not being read as part of the Read operation, wherein the greater gate voltage configures the modified memory cell such that it is more susceptible to a read disturb error than the plurality of memory cells.

5. The memory device of claim 3 wherein an amount of time the voltage applied to the gate of the modified memory cell during a Read operation is greater than an amount of time a voltage is applied to the gate of one of the plurality of memory cells that is not being read as part of the Read operation, wherein the greater amount of time over which the voltage is applied configures the modified memory cell such that it is more susceptible to a read disturb error than the plurality of memory cells.

6. The memory device of claim 1 wherein the modified memory cell is constructed in a manner that is different from the plurality of memory cells and such construction configures the modified memory cell in such a manner that it is more susceptible to a read disturb error than the plurality of memory cells.

7. The memory device of claim 6 wherein the modified memory cell is constructed such that the size of its floating gate transistor is different from the size of the floating gate transistors for the plurality of memory cells.

8. The memory device of claim 1 wherein the construction of the modified memory cell is substantially the same as the plurality of memory cells and further including circuitry to apply voltages to the modified memory cell to configure the modified memory cell such that, as a result of the applied voltages, it is more susceptible to read disturb errors than the plurality of memory cells.

9. The memory device of claim 1 wherein after a read disturb error has been detected for the at least one modified memory cell associated with the first block, the controller is configured to respond to a plurality of Read requests for pages within the first block by moving data associated with a requested page to a page in the second block without moving data associated with other pages in the first block to a different block, and modifying the logical-to-physical translation table to associate the moved data with the physical address of the page in the second block.

10. The memory device of claim 1 wherein each bitline of the N×M array has a modified cell associated therewith.

11. Apparatus for inhibiting errors in a group of memory cells in a memory device, the apparatus comprising:
at least one detecting cell comprising a floating gate transistor that is associated with the group of memory cells, the group of memory cells organized into a plurality of blocks, each block comprising an N×M array of memory cells, each column of the N×M array defining a bitline, the N×M array forming a plurality of pages, each page defining an individually addressable physical memory location, with one or more detecting cells associated with each block;
circuitry for applying a voltage to a gate of the at least one detecting cell each time one of the memory cells within the group of memory cells is accessed as part of a Read operation;
a sensor coupled to the at least one detecting cell and adapted to sense an electrical characteristic associated with the at least one detecting cell that corresponds to the amount of charge stored on the floating gate transistor of the at least one detecting cell; and
a comparator coupled to the sensor and adapted to compare the sensed electrical characteristic to a reference signal and provide an output, the output of the comparator generally providing an indication of increased likelihood of an error occurring within the group of memory cells;
wherein the memory device is configured accumulate a Block Read Count corresponding to the number of times any of the memory cells in a given block, including at least one detecting cell associated with the given block, have been read; and
respond to a plurality of Read requests for pages within the given block received after the Block Read Count has reached a predetermined number and no read disturb error has been detected for the at least one detecting cell associated with the given block, such response comprising moving data associated with a requested page to a page in different block from the given block, without moving data associated with other pages in the given block to the different block.

12. The apparatus of claim 11 wherein the group of memory cells and the detecting cell are all located within the same bitline.

13. The apparatus of claim 11 wherein the memory device is configured to access a logical-to-physical translation table that associates a logical address provided in a Write request with a physical address corresponding to a page within the given block.

14. The apparatus of claim 13 wherein the memory device is further configured to modify the logical-to-physical translation table to associate the moved data with the physical address of the page in the different block.

15. The apparatus of claim 11 wherein the construction of the detecting cell is the same as the construction of each of the memory cells within the group of memory cells.

16. The apparatus of claim 15 wherein the detecting cell has been identified through post-production testing as being more susceptible to read disturb errors than other memory cells within the group of memory cells.

17. The apparatus of claim 11 wherein the sensed electrical characteristic is voltage and wherein the reference signal is a reference voltage.

18. The apparatus of claim 17 further comprising circuitry coupled to the comparator for moving the data stored in the group of memory cells to new physical locations when the output of the comparator indicates that the sensed voltage exceeds the reference voltage.

19. The apparatus of claim 11 wherein the circuitry for moving the data stored in the group of memory cells moves all of the data in the group of memory cells to new physical locations when the output of the comparator indicates that there is an increased likelihood of an error.

20. A memory device, comprising:
a memory space formed from a plurality of memory cells, the memory space containing physical address locations to which data may be stored, the physical address locations being grouped into Pages and at least one Block, where each Page comprises a plurality of physical address locations that are addressed at the same time and each Block comprises an N×M array of memory cells, each column of the N×M array defining a bitline, the N×M array forming a collection of physical address locations that may be erased through a single erase operation;
detecting means associated with at least one Block for providing an output signal indicative of possible errors within the memory cells within the Block;
means for receiving a Read request directed to a given Page within a Block and for providing a voltage to: (i) the memory cells in the Pages within the Block that are not the target of the Read request, and (ii) the detecting means;
means for accumulating a Block Read Count corresponding to the number of times any of the memory cells in the Block have been read; and
means for responding to a plurality of Read requests for pages within the Block received after the Block Read Count has reached a predetermined number and no output signal has been provided by the detecting means indicative of possible errors within the memory cells within the Block, such response comprising moving the data stored within the Pages of the Block to pages within a different Block.

21. The memory device of claim 20 wherein the device further comprises means for receiving the output signal from the detecting means and for moving the data stored within the Pages of the Block to pages within a different Block upon the output signal from the detecting means.

22. The memory system of claim 21 wherein the means for receiving and moving the data stored within the Pages in the Block is configured to move the data for each Page within the Block upon the receipt of a Read request directed to the Page.

* * * * *